United States Patent
Zhao et al.

(10) Patent No.: US 11,467,657 B2
(45) Date of Patent: Oct. 11, 2022

(54) SYNCHRONIZATION OF MAGNETIC SENSOR SAMPLING FREQUENCY FOR BODY POSE TRACKING IN ARTIFICIAL REALITY SYSTEMS

(71) Applicant: Meta Platforms Technologies, LLC, Menlo Park, CA (US)

(72) Inventors: Yi Zhao, Redmond, WA (US); Mark David Hogan, Sammamish, WA (US)

(73) Assignee: META PLATFORMS TECHNOLOGIES, LLC, Menlo Park, CA (US)

(*) Notice: Subject to any disclaimer, the term of this patent is extended or adjusted under 35 U.S.C. 154(b) by 107 days.

(21) Appl. No.: 16/878,504

(22) Filed: May 19, 2020

(65) Prior Publication Data

US 2020/0371584 A1 Nov. 26, 2020

Related U.S. Application Data

(60) Provisional application No. 62/868,656, filed on Jun. 28, 2019, provisional application No. 62/851,593, filed on May 22, 2019.

(51) Int. Cl.
*G06F 3/01* (2006.01)
*H04W 4/80* (2018.01)
(Continued)

(52) U.S. Cl.
CPC ............ *G06F 3/011* (2013.01); *G01B 7/004* (2013.01); *G01B 7/30* (2013.01); *G01D 5/12* (2013.01);
(Continued)

(58) Field of Classification Search
None
See application file for complete search history.

(56) References Cited

U.S. PATENT DOCUMENTS 9,935,685 B2 * 4/2018 Lane .................. H04J 3/0655
10,599,217 B1 3/2020 Keller et al.
(Continued)

OTHER PUBLICATIONS

Office Action from U.S. Appl. No. 16/505,328, dated Feb. 25, 2021, 24 pp.
(Continued)

*Primary Examiner* — Ajit Patel
(74) *Attorney, Agent, or Firm* — Shumaker & Sieffert, P.A.

(57) ABSTRACT

Magnetic sensor synchronization techniques for pose tracking in artificial reality systems include managing and sending, by one or more primary magnetic sensors, a wireless synchronization signal to other magnetic sensors to trigger sensing sampling. The primary magnetic sensor may generate and send sensor data to a wireless data hub that operates as a sensor data collector and transmits data for pose tracking in the system. Each of the other (non-primary) magnetic sensors, in response to receiving the wireless synchronization signal, updates its sampling starting clock based on new synchronization timing. Each of the magnetic sensors sends generated sensor data to its corresponding primary sensor or wireless data hub according to a different schedule to avoid conflicts between the various magnetic sensors. The synchronization process may be repeated a number of times if a sensor fails to receive or respond to a synchronization signal.

19 Claims, 15 Drawing Sheets

(51) Int. Cl.
*H04W 76/10* (2018.01)
*G01B 7/004* (2006.01)
*G06F 1/16* (2006.01)
*H04L 1/08* (2006.01)
*H04L 7/02* (2006.01)
*H04L 43/0829* (2022.01)
*G01B 7/30* (2006.01)
*G01D 5/12* (2006.01)
*G01R 33/02* (2006.01)
*A63F 13/212* (2014.01)
*A63F 13/65* (2014.01)
*G09B 9/00* (2006.01)

(52) U.S. Cl.
CPC ......... *G01R 33/0206* (2013.01); *G06F 1/163* (2013.01); *G06F 3/017* (2013.01); *H04L 1/08* (2013.01); *H04L 7/02* (2013.01); *H04L 43/0829* (2013.01); *H04W 4/80* (2018.02); *H04W 76/10* (2018.02); *A63F 13/212* (2014.09); *A63F 13/65* (2014.09); *A63F 2300/1012* (2013.01); *A63F 2300/69* (2013.01); *G09B 9/00* (2013.01)

(56) References Cited

U.S. PATENT DOCUMENTS

| | | |
|---|---|---|
| 2009/0278791 A1 | 11/2009 | Slycke et al. |
| 2012/0158335 A1 | 6/2012 | Donovan et al. |
| 2014/0350894 A1 | 11/2014 | Yamashita et al. |
| 2015/0236869 A1 | 8/2015 | Vreeland et al. |
| 2015/0324636 A1* | 11/2015 | Bentley .................. A63F 13/212 386/227 |
| 2016/0036916 A1* | 2/2016 | Takeda .................... H04L 67/12 702/89 |
| 2016/0202755 A1 | 7/2016 | Connor |
| 2017/0041897 A1* | 2/2017 | Pitigoi-Aron ......... H04J 3/0685 |
| 2017/0230641 A1* | 8/2017 | Scavezze ............. H04N 13/239 |
| 2017/0336882 A1* | 11/2017 | Tome .................. G06F 3/03547 |
| 2018/0180448 A1* | 6/2018 | Miller ...................... G01D 5/12 |
| 2018/0182164 A1 | 6/2018 | Bognar et al. |
| 2018/0340804 A1 | 11/2018 | Cherkashin |
| 2019/0020433 A1* | 1/2019 | Pitigoi-Aron ....... H04W 56/001 |
| 2019/0243472 A1* | 8/2019 | Stafford .................. A63F 13/23 |
| 2019/0286234 A1* | 9/2019 | Condolo ............. G06Q 30/0242 |
| 2020/0272235 A1 | 8/2020 | Ng |
| 2020/0404994 A1 | 12/2020 | Yoon et al. |

OTHER PUBLICATIONS

Response to Office Action dated Feb. 25, 2021, from U.S. Appl. No. 16/505,328, filed May 25, 2021, 18 pp.

Notice of Allowance from U.S. Appl. No. 16/505,328, dated Jul. 16, 2021, 11 pp.

International Search Report and Written Opinion of International Application No. PCT/US2020/033824, dated Aug. 18, 2020, 12 pp.

U.S. Appl. No. 16/505,328, filed Jul. 8, 2019 naming inventor Yi Zhao.

* cited by examiner

SYNCHRONIZATION OF MAGNETIC SENSOR SAMPLING FREQUENCY FOR BODY POSE TRACKING IN ARTIFICIAL REALITY SYSTEMS

This application claims the benefit of U.S. Provisional Application No. 62/851,593 entitled "MAGNETIC SENSORS FOR BODY POSE TRACKING IN ARTIFICIAL REALITY SYSTEMS," and filed on May 22, 2019 and U.S. Provisional Application No. 62/868,656 entitled "SYNCHRONIZATION OF MAGNETIC SENSOR SAMPLING FREQUENCY FOR BODY POSE TRACKING IN ARTIFICIAL REALITY SYSTEMS," and filed on Jun. 28, 2019. The entire content of Application No. 62/851,593 and Application No. 62/868,656 are incorporated herein by reference.

TECHNICAL FIELD

This disclosure generally relates to artificial reality systems, such as virtual reality, mixed reality and/or augmented reality systems, and more particularly, to using sensor data from magnetic sensors to perform pose tracking or assist in pose tracking for artificial reality applications.

BACKGROUND

Artificial reality systems are becoming increasingly ubiquitous with applications in many fields such as computer gaming, health, and safety, industrial, and education. As a few examples, artificial reality systems are being incorporated into mobile devices, gaming consoles, personal computers, movie theaters, and theme parks. In general, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof.

Typical artificial reality systems include one or more devices for rendering and displaying content to users. As one example, an artificial reality system may incorporate a head mounted display (HMD) worn by a user and configured to output artificial reality content to the user. The artificial reality content may include computer-generated content or generated content combined with captured content (e.g., real-world video and/or images). During operation, the user typically interacts with the artificial reality system to select content, launch applications, or otherwise configure the system.

SUMMARY

In general, this disclosure describes techniques for using magnetic sensors to perform, or assist in performing, body pose tracking and for synchronizing magnetic sensors to improve accuracy of body pose tracking. The techniques may be applied for use in artificial reality systems.

The disclosure describes an artificial reality system that includes a head-mounted display (HMD) and body-mounted magnetic sensors of a magnetic sensor system to perform body pose tracking. In some examples, the body-mounted magnetic sensors may be included in a wearable article (e.g., a vest, a shirt, a jacket, arm bands, and/or chest bands) positioned on a user's arms and torso. The wearable article may include wireless magnetic sensors along with a transmitter and a power supply. The magnetic sensors are positioned on the user's body so as to maximize tracking accuracy and minimize interference between the magnetic sensors, the transmitter, and the battery.

The disclosure describes sensor synchronization techniques for multiple magnetic sensors positioned at different locations on a body, for accurate body pose tracking in artificial reality systems. The synchronization techniques include managing and sending, by one or more primary magnetic sensors, a wireless synchronization signal to other magnetic sensors to trigger sensing sampling. The primary magnetic sensor may be mounted to an HMD or to a peripheral device, for example. The primary magnetic sensor may generate and send sensor data to a wireless data hub that operates as a sensor data collector and transmits data to a computing device that performs pose tracking for the system. Each of the other (non-primary) magnetic sensors, in response to receiving the wireless synchronization signal, updates its sampling starting clock based on new synchronization timing. If a non-primary magnetic sensor does not receive the wireless synchronization signal, then, based on the previous frame, the non-primary magnetic sensor estimates a time based on 60 Hz (to give an example frequency). Each of the magnetic sensors sends generated sensor data to its corresponding primary sensor or wireless data hub according to a different schedule to avoid conflicts between the various magnetic sensors. If the primary sensor or wireless data hub does not receive sensor data from one or more or, in some examples, from all of the magnetic sensors, the synchronization process described above may be repeated a number of times, based on an acknowledgement strategy.

The disclosure further describes techniques for synchronizing magnetic sensor sampling frequency that may leverage existing wireless connection protocols to align sensor sampling with an internal system event, e.g., the center of a camera exposure window for an image capture device of the HMD. For example, the primary magnetic sensor may receive a trigger signal from the HMD and, in response, send a wireless connection request command that comprises a wireless synchronization signal to one or more other magnetic sensors of a magnetic sensor system. The wireless connection request command may be an initial command, e.g., a connection request or handshake, used to establish or re-establish a wireless communication channel, e.g., Bluetooth, WiFi, or the like, between the primary magnetic sensor and another magnetic sensor. The wireless connection request command can be sent by the primary magnetic sensor at a fixed schedule and can specify a start sampling time based on a time at which the other magnetic sensor receives the command. In this way, even though the primary sensor does not know which other sensors are listening, any of the other sensors that receive and respond to the command will align their sampling starting clock with the internal system event. In the case where the internal system event is a camera exposure window, the synchronization techniques described herein may enable the generated sensor data to be associated with a particular image frame captured by the image capture device of the HMD in order to achieve higher accuracy body pose tracking.

The disclosure also describes techniques for enabling simultaneous operation of multiple primary magnetic sensors in the magnetic sensor system in which each of the primary magnetic sensors is configured to manage synchronization of sampling frequency for discrete groups of other magnetic sensors in the magnetic sensor system. In this way, the number of magnetic sensors used for body pose tracking may be increased while avoiding bandwidth and interference issues.

In some aspects, a method includes receiving, by a primary magnetic sensor, an indication of a trigger event from an internal system; in response to receiving the indication, transmitting, by the primary magnetic sensor, a synchronization signal to each of a plurality of magnetic sensors, wherein the synchronization signal includes a sampling start time; in response to receiving the synchronization signal, determining, by each magnetic sensor of the plurality of magnetic sensors based on the sampling start time, a sampling time for the magnetic sensor; sampling, by each magnetic sensor of the plurality of magnetic sensors at the sampling time for the magnetic sensor, a magnetic field generated by a magnetic transmitter associated with the plurality of magnetic sensors to generate sensor data of the magnetic sensor; providing, by each magnetic sensor of the plurality of magnetic sensors, to the primary magnetic sensor, sensor data of the magnetic sensor, wherein the sensor data of the magnetic sensor is transmitted according to a transmission time that is based at least in part on the sampling time and an offset time for the magnetic sensor, wherein the offset times for at least two of the plurality of magnetic sensors are different; and providing, by the primary magnetic sensor, to a pose detector, the sensor data of each magnetic sensor of the plurality of magnetic sensors.

In some aspects, an artificial reality system includes an image capture device configured to capture image data representative of a physical environment; a head mounted display (HMD) configured to output artificial reality content; a magnetic transmitter configured to generate a magnetic field; and a plurality of magnetic sensors including a primary magnetic sensor and non-primary magnetic sensors, wherein the primary magnetic sensor is configured to: receive an indication of a trigger event from the HMD, and in response to receipt of the indication, transmit a synchronization signal to each non-primary magnetic sensor of the non-primary magnetic sensors, wherein the synchronization signal includes a sampling start time; wherein each non-primary magnetic sensor of the non-primary magnetic sensors is configured to: in response to receipt of the synchronization signal, determine based on the sampling start time, a sampling time for the non-primary magnetic sensor, sample, at the sampling time for the non-primary magnetic sensor, a magnetic field generated by the magnetic transmitter to generate sensor data of the magnetic sensor, and provide, to the primary magnetic sensor, sensor data of the non-primary magnetic sensor, wherein the sensor data of the non-primary magnetic sensor is transmitted according to a transmission time that is based at least in part on the sampling time and an offset time for the non-primary magnetic sensor, wherein the offset times for at least two of the non-primary magnetic sensors are different; wherein the primary magnetic sensor is further configured to provide, to a pose detector of the artificial reality system, sensor data of the primary magnetic sensor and the sensor data of each non-primary magnetic sensor of the plurality of magnetic sensors, wherein the pose detector is configured to determine a pose for an object based, at least in part on the image data, the sensor data of each non-primary magnetic sensor of the plurality of magnetic sensors, and sensor data of the primary magnetic sensor.

In some aspects, a magnetic sensor system includes a magnetic transmitter configured to generate a magnetic field; and a plurality of magnetic sensors including a primary magnetic sensor and non-primary magnetic sensors, wherein the primary magnetic sensor is configured to: receive an indication of a trigger event from a trigger source, and in response to receipt of the indication, transmit a synchronization signal to each non-primary magnetic sensor of the non-primary magnetic sensors, wherein the synchronization signal includes a sampling start time; wherein each non-primary magnetic sensor of the non-primary magnetic sensors is configured to: in response to receipt of the synchronization signal, determine based on the sampling start time, a sampling time for the non-primary magnetic sensor, sample, at the sampling time for the non-primary magnetic sensor, a magnetic field generated by the magnetic transmitter to generate sensor data of the magnetic sensor, provide, to the primary magnetic sensor, sensor data of the non-primary magnetic sensor, wherein the sensor data of the non-primary magnetic sensor is transmitted according to a transmission time that is based at least in part on the sampling time and an offset time for the non-primary magnetic sensor, wherein the offset times for at least two of the non-primary magnetic sensors are different; and wherein the primary magnetic sensor is further configured to provide, as output of the magnetic sensor system, sensor data of the primary magnetic sensor and the sensor data of each non-primary magnetic sensor of the plurality of magnetic sensors.

The details of one or more examples of the techniques of this disclosure are set forth in the accompanying drawings and the description below. Other features, objects, and advantages of the techniques will be apparent from the description and drawings, and from the claims.

BRIEF DESCRIPTION OF DRAWINGS

Like reference characters refer to like elements throughout the figures and description.

DETAILED DESCRIPTION

Image-based body pose computation has limitations. Parts of a user's body can be occluded with long hair or irregular-shaped clothes, or with other body parts, or other objects. Realistic lighting can be complicated and hard to simulate, it may have lighting or shadow artifacts as well. This interference can cause erroneous data values in a data collection system. For inside-out data collection (i.e., image data collection by image capture devices integrated with an HMD), because of the limited field of view, some parts of a user's body may not even be captured at all. An IMU-based system may address the occlusion problem, but IMU position tracking may drift over time and change in different environments. With an IMU-based system, therefore, it may be difficult to detect clapping (for example) and other two-handed gestures, and the tracking may not be accurate when a user moves between different spaces. Infrared sensor tracking may provide higher accuracy, but realistic clothes (for example) may not be captured and there may be challenges to operate in some environments (e.g., outdoors) due to potential interference.

A magnetic sensor system, as described herein, may provide the advantages of the image-based and IMU systems and address their drawbacks for body motion ground truth. For example, the magnetic sensor system provides occlusion free sensor tracking and may provide higher accuracy of orientation and position tracking.

The number of magnetic sensors used in a magnetic sensor system may affect the accuracy of poses determined based in the magnetic sensors. However, as the number of magnetic sensors in a system increases, there is a greater probability of using all available bandwidth of a wireless network coupling the magnetic sensors. Further, there may be a greater probability of network interference. In some aspects, magnetic sensors may be placed in different groups that communicate magnetic sensor data to a primary sensor or data hub, which in turn communicates the collected data to a data receiver such as a pose tracker or machine-learning system.

Figure 1A:
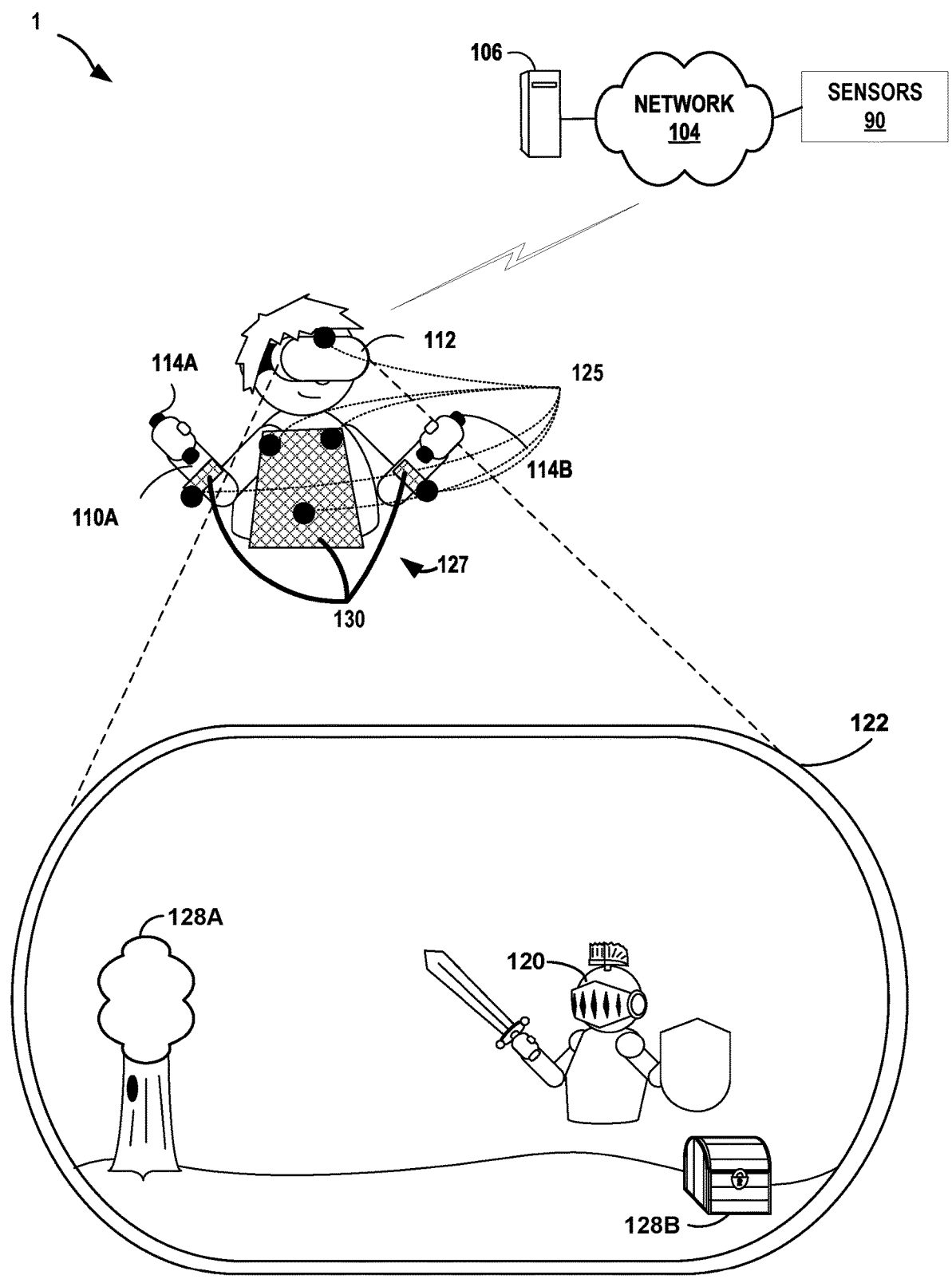
FIG. 1A is an illustration depicting an example artificial reality system that uses magnetic sensor data to perform body pose tracking in accordance with techniques of the disclosure.

FIG. 1A is an illustration depicting an example artificial reality system 1 that uses magnetic sensor data to perform body pose tracking. Artificial reality system 1 may synchronize sampling and data transmission of magnetic sensors to improve accuracy of body pose tracking.

In the example of FIG. 1A, artificial reality system 1 includes head-mounted display (HMD) 112, console 106, magnetic sensor system 127, and, in some examples, one or more sensors 90 and/or controllers 114A-114B (collectively, "controllers 114") for HMD 112. As shown, HMD 112 is typically worn by user 110 and includes an electronic display and optical assembly for presenting artificial reality content 122 having images 120 and content objects 128A-128B to the user. In addition, HMD 112 includes one or more sensors (e.g., accelerometers) for tracking motion of the HMD and may include one or more image capture devices, e.g., cameras, line scanners and the like, for capturing image data of the surrounding environment. Each controller 114 is an input device which user 110 may use to provide input to console 106, HMD 112, or another component of artificial reality system 1.

In general, artificial reality system 10 uses information captured from a real-world, 3D physical environment to render artificial reality content 122 for display to user 110. In the example of FIG. 1A, user 110 views the artificial reality content 122 constructed and rendered by an artificial reality application executing on console 106 and/or HMD 112. As one example, artificial reality content 122 may be a consumer gaming application in which user 110 is rendered as avatar 120 with one or more virtual objects 128A, 128B. In some examples, artificial reality content 122 may comprise a mixture of real-world imagery and virtual objects, e.g., mixed reality and/or augmented reality. In other examples, artificial reality content 122 may be, e.g., a video conferencing application, a navigation application, an educational application, training or simulation applications, or other types of applications that implement artificial reality. As used in this disclosure, the phrase "A and/or B" may refer to A only, B only, or both A and B.

HMD 112 can be a user device in that HMD 112 is a computing device used by a user to interact with other components of artificial reality system 1. Artificial reality system 1 may, in other examples, include a set of one or more instances of HMDs 112 all operating concurrently within the physical 3D environment In the example of FIG. 1A, console 106 is shown as a single computing device, such as a gaming console, workstation, a desktop computer, or a laptop. In other examples, console 106 may be distributed across a plurality of computing devices, such as a distributed computing network, a data center, or a cloud computing system. Console 106, HMD 112, controllers 114, and sensors 90 may, as shown in this example, be communicatively coupled via network 104, which may be a wired or wireless network, such as Wi-Fi, a mesh network or a short-range wireless communication medium. Controllers 114 may be in communication with HMD 112 using near-field communication or short-range wireless communication such as Bluetooth, using wired communication links, or using another type of communication links. Although HMD 112 is shown in this example as in communication with, e.g., tethered to or in wireless communication with, console 106, in some implementations HMD 112 operates as a stand-alone, mobile artificial reality system. As such, some or all functionality attributed to console 106 in this disclosure may be distributed among one or more user devices, such as one or more instances of HMD 112.

In accordance with techniques of this disclosure, a wearable magnetic sensor system 127 includes wearable article 130 configured to spatially arrange a plurality of multiple magnetic sensors 125 on a body of user 110. Magnetic sensors 125 are configured to generate and output respective magnetic sensor data indicative of respective locations of the magnetic sensors 125. Artificial reality system 1 may use such magnetic sensor data, along with other data such as sensed data received from HMD 112, and, in some examples, data from any external sensors 90, such as external cameras, to compute a body pose of user 110. A "body pose", as used herein, refers not only to a location and overall orientation of a user's body, but also refers to the configuration of the user's body, e.g., where their various body parts are located in relation to one another. Tracking and rendering, using an artificial reality system for example, a body pose over time to create an avatar, allows the artificial reality system to create animations of a user avatar by rendering the avatar in the configuration of the computed body pose at each time or frame.

In FIG. 1A, a magnetic sensor system 127 includes body-mounted magnetic sensors 125 used to perform body pose tracking. In some examples, each magnetic sensor 125 includes a magnetic sensor configured to generate magnetic sensor data indicative of a magnetic field sensed by the magnetic sensor 125. In some examples, wearable article 130 affixes at least one magnetic transmitter (not shown in FIG. 1A) at a location on a torso of user 110, the magnetic transmitter configured to generate the magnetic field sensed by each magnetic sensor 125. In some examples, each magnetic sensor 125 further includes an IMU configured to generate IMU data sensed at the respective magnetic sensor 125.

In some examples, the body-mounted magnetic sensors 125 may be included in one or more wearable articles 130 (e.g., a vest, a shirt, a jacket, arm bands, and/or chest bands) positioned on a user's arms and torso. In the example shown in FIG. 1A, user 110 is wearing a vest and two arm bands that are wearable articles of a magnetic sensor system 127 and that each includes at least one of magnetic sensors 125. The magnetic sensor system 127 may include wireless magnetic sensors 125 along with a transmitter and a power supply, which may also be included on one of the wearable articles. The magnetic sensors 125 are positioned on the user's body so as to maximize tracking accuracy and minimize interference between the magnetic sensors 127, the transmitter (not shown), and the battery (not shown). The wearable article may comprise a relatively rigid structure in order to stabilize the magnetic sensors without inhibiting movement by the user. In addition, the wearable article may be constructed to hold the components (e.g., a vest, a shirt, a jacket, arm bands, and/or chest bands) on the user's body with appropriate weight distribution to contribute to user comfort.

Figure 1B:
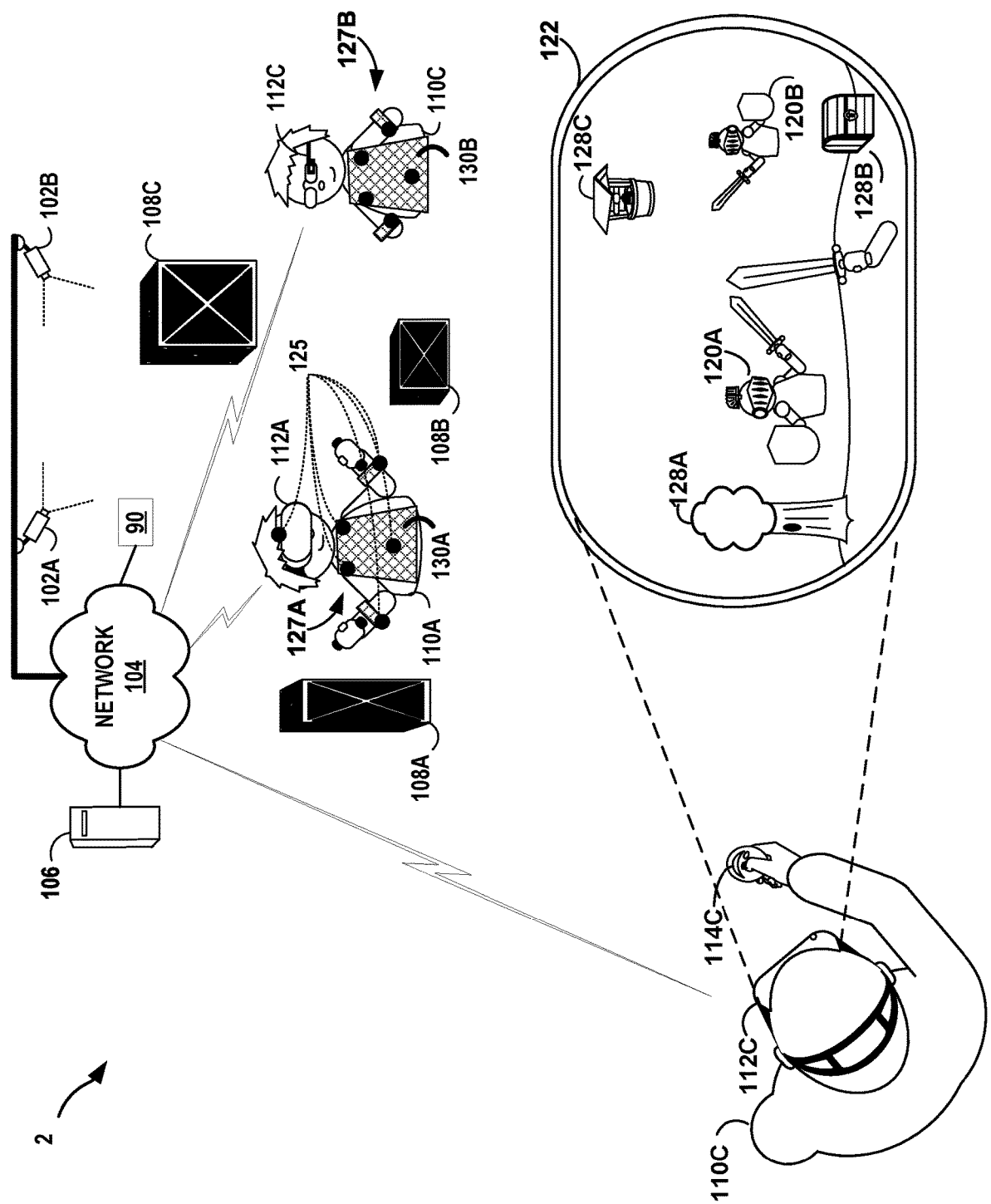
FIG. 1B is an illustration depicting another example artificial reality system that uses magnetic sensor data to perform body pose tracking in accordance with techniques of the disclosure.

FIG. 1B is an illustration depicting another example artificial reality system 2 that uses magnetic sensors to perform body pose tracking. In this example, artificial reality system 2 includes cameras 102A and 102B (collectively, "cameras 102"), HMDs 112A-112C (collectively, "HMDs 112"), console 106, and sensors 90. HMDs 112B and 112C operate in a substantially similar fashion as HMD 112 of FIG. 1A. Magnetic sensor systems 127A and 127B may operate in a substantially similar fashion as magnetic sensor system 127 of FIG. 1A

As shown in FIG. 1B, artificial reality system 2 provides a multi-user artificial reality application executing on console 106 and/or HMDs 112 to present artificial reality content to each user based on a current viewing perspective of a corresponding frame of reference for that user. That is, in this example, the artificial reality application constructs artificial content by tracking and computing pose information for a frame of reference for each of HMDs 112. Artificial reality system 2 uses data received from cameras 102, HMDs 112, magnetic sensor systems 127 and controllers 114 to capture 3D information within the real-word, physical 3D environment, such as motion by users 110 and/or tracking information with respect to users 110 and objects 108, for use in computing updated pose information for a corresponding frame of reference of HMDs 112. As one example, the artificial reality application may render, based on a current viewing perspective determined for HMD 112C, artificial reality content 122 having virtual objects 128A-128C (collectively, "virtual objects 128") as spatially overlaid upon real world objects 108A-108C (collectively, "real world objects 108"). Further, from the perspective of HMD 112C, artificial reality system 2 renders avatars 120A, 120B based upon the estimated positions and poses for users 110A, 110B, respectively.

In FIG. 1B, both user 110A and user 110C are wearing examples of a magnetic sensor system, in accordance with techniques of this disclosure. User 110B may not be wearing a magnetic sensor system, in which case pose information for user 110B may not be based on magnetic sensors. In other words, artificial reality system 2 may compute pose information for a user with or without magnetic sensor data.

Figure 2A:
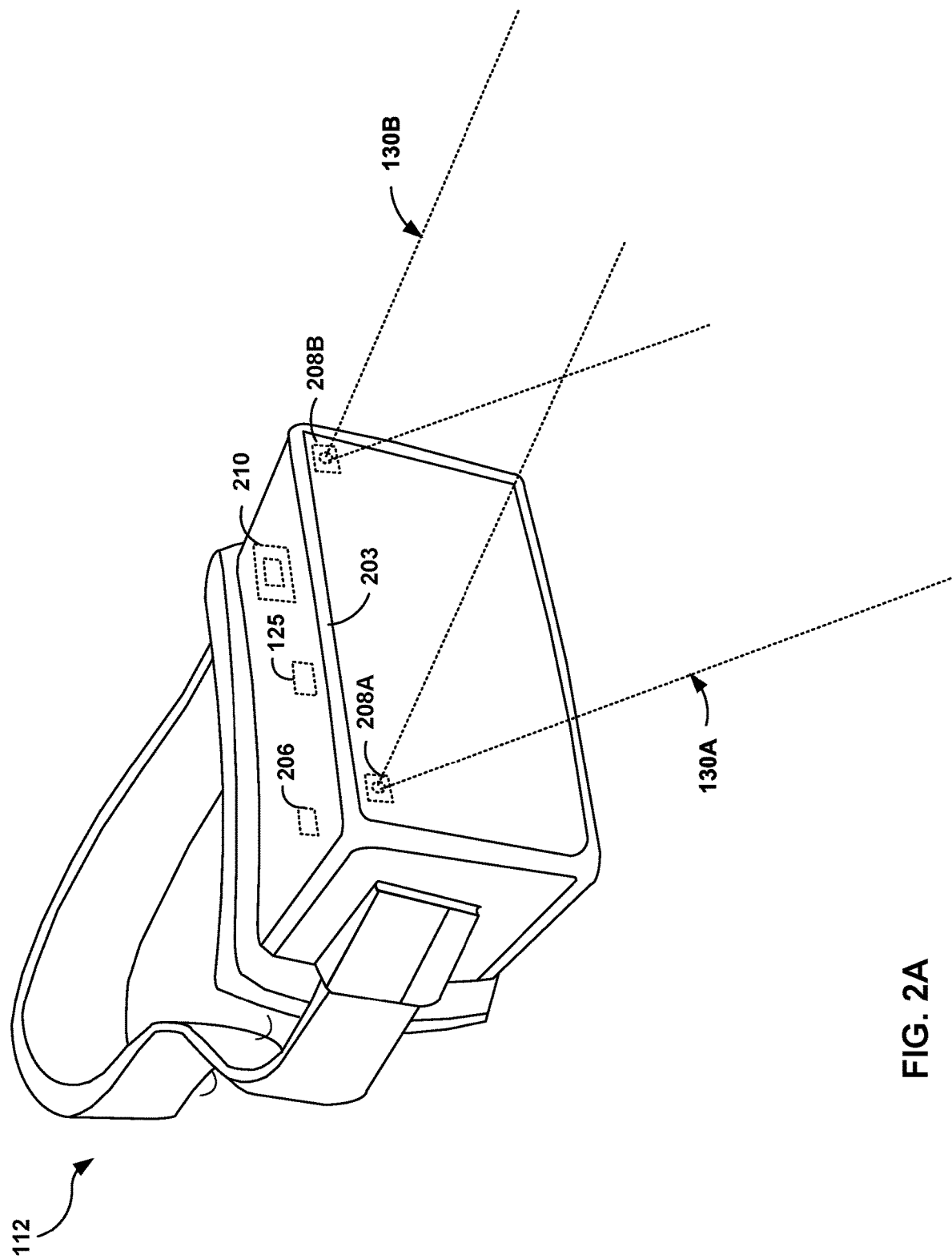
FIG. 2A is an illustration depicting an example HMD configured to operate in accordance with the techniques of the disclosure.

FIG. 2A is an illustration depicting an example HMD 112 configured to operate in accordance with the techniques of the disclosure. HMD 112 of FIG. 2A may be an example of any of HMDs 112 of FIGS. 1A and 1B. HMD 112 may be part of an artificial reality system, such as artificial reality systems 1, 2 of FIGS. 1A, 1B, or may operate as a standalone, mobile artificial realty system configured to implement the techniques described herein. HMD 112 may include a mobile device (e.g., a smart phone) that is removable from the body of the HMD 112.

In this example, HMD 112 includes a front rigid body and a band to secure HMD 112 to a user. In addition, HMD 112 includes an interior-facing electronic display 203 configured to present artificial reality content to the user. Electronic display 203 may be any suitable display technology, such as liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating visual output. In some examples, the electronic display is a stereoscopic display for providing separate images to each eye of the user. In some examples, the known orientation and position of display 203 relative to the front rigid body of HMD 112 is used as a frame of reference, also referred to as a local origin, when tracking the position and orientation of HMD 112 for rendering artificial reality content according to a current viewing perspective of HMD 112 and the user.

As further shown in FIG. 2A, in this example HMD 112 further includes one or more sensors 206, such as one or more accelerometers (also referred to as inertial measurement units or "IMUs") that output data indicative of current acceleration of HMD 112, GPS sensors that output data indicative of a location of HMD 112, radar or sonar sensors that output data indicative of distances of the HMD 112 from various objects, or other sensors that provide indications of a location or orientation of HMD 112 or other objects within a physical 3D environment. Moreover, HMD 112 may include one or more integrated image capture devices 208, such as a video camera, laser scanner, Doppler radar scanner, depth scanner, or the like, configured to output image data representative of a surrounding real-world environment. Further, HMD 112 may include a magnetic sensor 125. The magnetic sensor 125 may be separate from or may be integrated with magnetic sensor system 127 (FIGS. 1A and 1B). The magnetic sensor 125 may be integral to HMD 112 or it may be an attachment to HMD 112. HMD 112 includes an internal control unit 210, which may include an internal power source and one or more printed-circuit boards having one or more processors, memory, and hardware to provide an operating environment for executing programmable operations to process sensed data and present artificial-reality content on display 203. Internal control unit 210 may be part of a removable computing device, such as a smart phone.

The HMD 112 may compute, based in part on sensed data generated by motion sensors 206, magnetic sensor system 127 (FIGS. 1A, 1B), and/or images generated by image capture devices 208, a current pose for a frame of reference of HMD 112. Internal control unit 210 may include a pose tracking unit, which can execute software for processing the sensed data and/or images to compute the current pose. Internal control unit 210 may store a master 3D map for a physical environment and compare processed images to the master 3D map to compute the current pose. Alternatively, or additionally, internal control unit 210 may compute the current pose based on sensor data generated by sensors 206 and/or magnetic sensor system 127. Based on the computed current pose, internal control unit 210 may render artificial reality content corresponding to the master 3D map for an artificial reality application, and internal control unit 210 may display the artificial reality content via the electronic display 203.

In some examples, internal control unit 210 may peer with one or more controllers for HMD 112 (controllers not shown in FIG. 2A). Internal control unit 210 may receive sensor data from the controllers that provides indications of user inputs or controller orientations or locations within the physical 3D environment or relative to HMD 112. Internal control unit 210 may send representations of the sensor data to a console for processing by the artificial reality application, where the indications may be event data for an artificial reality application. Internal control unit 210 may execute the artificial reality application to process the sensor data.

Figure 2B:
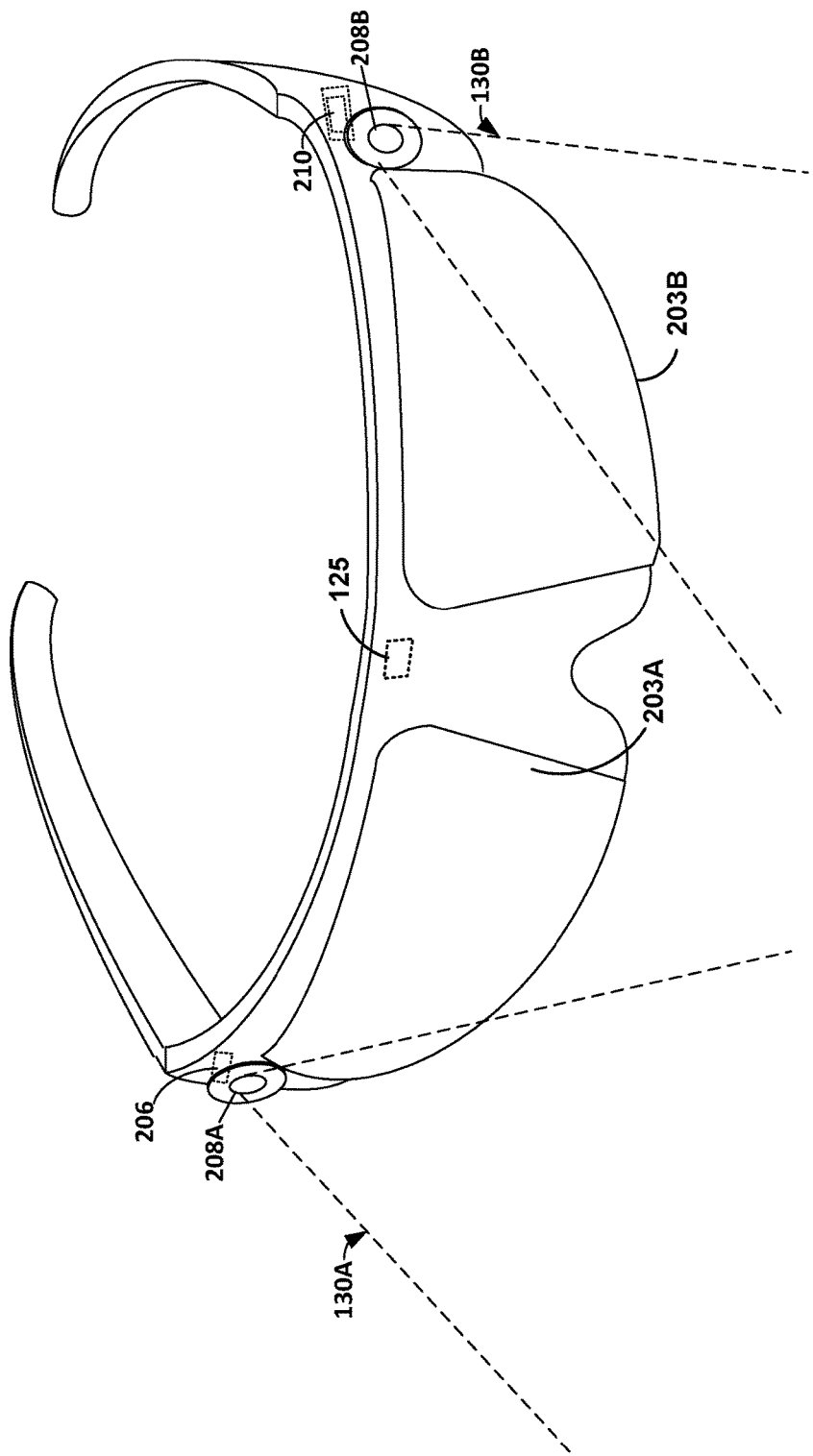
FIG. 2B is an illustration depicting another example HMD configured to operate in accordance with the techniques of the disclosure.

FIG. 2B is an illustration depicting another example HMD configured to operate in accordance with the techniques of the disclosure. HMD 112 of FIG. 2B may be an example of any of HMDs 112 of FIGS. 1A and 1B. HMD 112 may be part of an artificial reality system, such as artificial reality systems 1, 2 of FIGS. 1A, 1B, or may operate as a stand-alone, mobile artificial realty system configured to implement the techniques described herein. HMD 112 of FIG. 2B may operate in a substantially similar fashion as HMD 112 of FIG. 2A.

In the example of FIG. 2B, HMD 112 comprises an eyeglass form factor that includes a rigid frame front having two eyepieces connected by a nose bridge and two temples or arms that fit over a user's ears to secure HMD 112 to the user. In addition, in place of lenses in a traditional pair of eyeglasses, HMD 112 includes interior-facing electronic display 253 configured to present artificial reality content to the user. Electronic display 253 may be any suitable display technology, such as liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating visual output. In some examples, electronic display 253 is a stereoscopic display for providing separate images to each eye of the user. In some examples, the known orientation and position of display 253 relative to the rigid frame front of HMD 112 is used as a frame of reference, also referred to as a local origin, when tracking the position and orientation of HMD 112 for rendering artificial reality content according to a current viewing perspective of HMD 112 and the user.

As further shown in FIG. 2B, in this example HMD 112 further includes one or more motion sensors 206, such as one or more accelerometers (also referred to as inertial measurement units or "IMUs") that output data indicative of current acceleration of HMD 112, GPS sensors that output data indicative of a location of HMD 112, radar, or sonar that output data indicative of distances of HMD 112 from various objects, or other sensors that provide indications of a location or orientation of HMD 112 or other objects within a physical environment. Moreover, HMD 112 may include one or more integrated image capture devices 208A and 208B (collectively, "image capture devices 208"), such as video cameras, laser scanners, Doppler® radar scanners, depth scanners, or the like, configured to capture image data representative of the physical environment. HMD 112 may also include one or more integrated audio capture devices 212A and 212B (collectively "audio capture devices 212"), such dynamic microphones, condenser microphones, piezoelectric microphones, or the like coupled to digital audio recording devices, configured to capture audio data of the user and the physical environment. Further, HMD 112 can include a magnetic sensor 125. The magnetic sensor may be separate from or may be integrated with magnetic sensor system 127 (FIGS. 1A and 1B).

HMD 112 includes an internal control unit 210, which may include an internal power source and one or more printed-circuit boards having one or more processors, memory, and hardware to provide an operating environment for executing programmable operations to process sensed data and present artificial-reality content on display 253.

Figure 3:
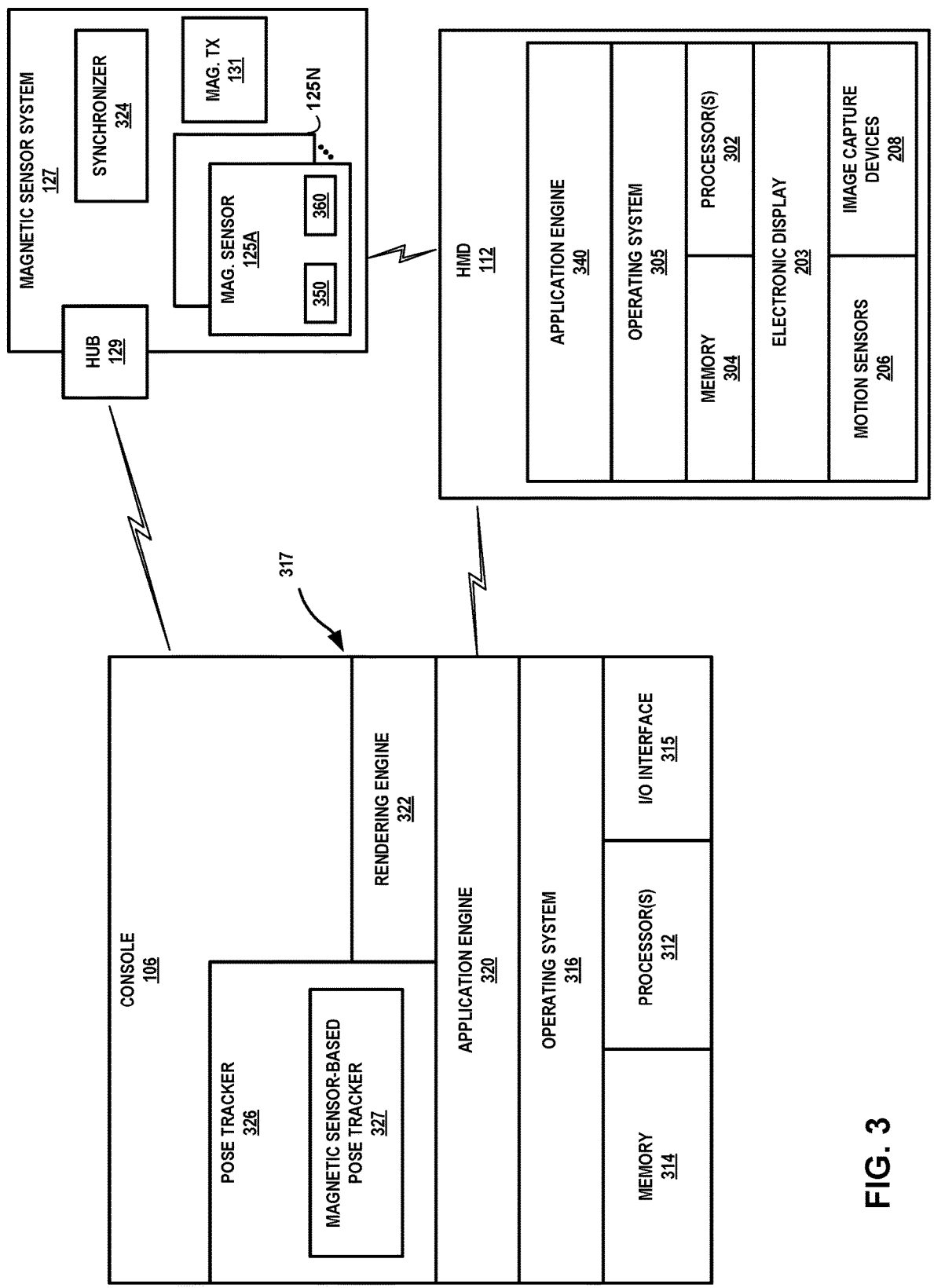
FIG. 3 is a block diagram showing example implementations of a console, a magnetic sensor system, and a user device, such as any of the HMDs or a user device of FIGS. 1A-1B, or 2A-2B.

FIG. 3 is a block diagram showing example implementations of console 106, magnetic sensor system 127, and HMD 112 of FIGS. 1A-1B, or 2A-2B. In the example of FIG. 3, console 106 performs pose tracking, gesture detection, and user interface generation and rendering for HMD 112 in accordance with the techniques described herein based on sensed data, such as motion data and image data received from HMD 112 and/or data from magnetic sensor system 127 or other external sensors.

In this example, HMD 112 includes one or more processors 302 and memory 304 that, in some examples, provide a computer platform for executing an operating system 305, which may be an embedded, real-time multitasking operating system, for instance, or other type of operating system. In turn, operating system 305 provides a multitasking operating environment for executing one or more software components 317, including application engine 340. As discussed with respect to the example of FIG. 2, processors 302 are coupled to electronic display 203, motion sensors 206 and image capture devices 208, but other examples of HMD 112 may include neither or merely one of motion sensors 206 or image capture devices 208. In some examples, processors 302 and memory 304 may be separate, discrete components. In other examples, memory 304 may be on-chip memory collocated with processors 302 within a single integrated circuit. The memory 304, processors 302, operating system 305, and application engine 340 components may collectively represent an example of internal control unit 210 of FIGS. 2A and 2B.

Operating system 305 provides an operating environment for executing one or more software components, which include application engine 340. Application engine 340 may be an artificial reality application having one or more processes. Application engine 340 may send, to console 106 as mapping information using an I/O interface (not shown in FIG. 3) via a network or other communication link, representations of sensor data generated by magnetic system 127, motion sensors 206 or images generated by image capture devices 208. Artificial reality application 340 may be, e.g., a teleconference application, a gaming application, a navigation application, an educational application, or training or simulation application, for example.

In general, console 106 is a computing system that interfaces with user devices such as HMDs 112 and/or magnetic sensor system 127 of an artificial reality system. In some examples, console 106 is a single computing device, such as a workstation, a desktop computer, a laptop. In some examples, at least a portion of console 106, such as processors 312 and/or memory 314, may be distributed across one or more computing devices, a cloud computing system, a data center, or across a network, such as the Internet, another public or private communications network, for instance, broadband, cellular, Wi-Fi, and/or other types of communication networks, for transmitting data between computing systems, servers, and computing devices.

In the example of FIG. 3, console 106 includes one or more processors 312 and memory 314 that provide a computer platform for executing an operating system 316. In turn, operating system 316 provides an operating environment for executing one or more software components 317. Processors 312 are coupled to I/O interface 315, which provides one or more I/O interfaces for communicating with external devices, such as a keyboard, game controllers, display devices, image capture devices, and the like. Moreover, I/O interface 315 may include one or more wired or wireless network interface cards (NICs) for communicating with a network, such as network 104. Each of processors 302, 312 may comprise any one or more of a multi-core processor, a controller, a digital signal processor (DSP), an application specific integrated circuit (ASIC), a field-programmable gate array (FPGA), or equivalent discrete or integrated logic circuitry. Memory 304, 314 may comprise any form of memory for storing data and executable software instructions, such as random-access memory (RAM), read-only memory (ROM), programmable read-only memory (PROM), erasable programmable read-only memory (EPROM), electronically erasable programmable read-only memory (EEPROM), and/or Flash memory.

Software components 317 of console 106 operate to provide an overall artificial reality application. In this example, software components 317 include application engine 320, rendering engine 322, pose tracker 326, and magnetic sensor synchronizer 324.

In general, application engine 320 includes functionality to provide and present an artificial reality application, e.g., a teleconference application, a gaming application, a navigation application, an educational application, training or simulation applications, and the like. Application engine 320 and application engine 340 may cooperatively provide and present the artificial reality application in some examples. Application engine 320 may include, for example, one or more software packages, software libraries, hardware drivers, and/or Application Program Interfaces (APIs) for implementing an artificial reality application on console 106. Responsive to control by application engine 320, rendering engine 322 generates 3D artificial reality content for display to the user by application engine 340 of HMD 112.

Application engine 320 and rendering engine 322 construct the artificial content for display to user 110 in accordance with current pose information for a frame of reference, typically a viewing perspective of HMD 112, as determined by pose tracker 326. Based on the current viewing perspective, rendering engine 322 constructs the 3D, artificial reality content which may be overlaid, at least in part, upon the physical 3D environment in which HMD 112 is located. During this process, pose tracker 326 may operate on sensed data received from HMD 112, such as movement information and user commands, and, in some examples, data from magnetic sensor system 127 and any external sensors 90 or external camera 102 (as shown in FIGS. 1A, 1B) to capture 3D information within the physical 3D environment, such as motion by user 110, and/or feature tracking information with respect to user 110. Based on the sensed data, pose tracker 326 determines a current pose for the frame of reference of HMD 112 and, in accordance with the current pose, generates the artificial reality content for communication to HMD 112 for display to the user via electronic display 203.

In accordance with techniques described herein, magnetic sensor system 127 includes multiple magnetic sensors 125 that each generate sensor data and wirelessly sends the sensor data to data hub 129. In some examples, each magnetic sensor 125 includes sensor 350 and supporting circuitry that generates magnetic sensor data from a sensed magnetic field generated by magnetic transmitter 131. Each sensor 350 may be a 3-axis sensor. As used herein, the term "magnetic sensor" may refer to either sensor 350 or magnetic sensor 125 that includes sensor 350. In some examples, each magnetic sensor 125 includes IMU 360 (e.g., accelerometer and/or gyroscope) that generates IMU data for the magnetic sensor 125. Each magnetic sensor 1125 transmits the magnetic sensor data and IMU data to data hub 129.

In some aspects a magnetic sensor 125 may be configured as a data hub 129. In some aspects, data hub 129 may be a separate device included in magnetic sensor system 127. Data hub 129 may be integrated with HMD 112, a peripheral device, a smart phone or other personal computing device, or other device capable of wirelessly receiving data from magnetic sensors 125 and wireless transmitting the collected data to another device. As one example, data hub 129 may be a peripheral device (sometimes referred to as a "stage" device) that coexists with HMD 112 and, in some examples, operates as an auxiliary input/output device for HMD 112 in the virtual environment. In some examples, the peripheral device may operate as an artificial reality co-processing device to which some of the functions of HMD 112 are offloaded. Magnetic transmitter 131 creates the magnetic field used by each magnetic sensor 125 to generate sensor data indicative of a location of the magnetic sensor 125 in relation to the magnetic transmitter 131.

Data hub 129 wirelessly sends the collected sensor data (or a representation thereof) to console 106, either directly or via HMD 112. Magnetic sensors 125 may each be coupled to electronic circuitry that manages timing of sensor data sampling, as well as sensor data generation and transmission to data hub 129. The electronic circuitry may include timing circuitry or instructions that receive synchronization signals from other components of artificial reality system 1, 2 such as HMD 112, console 106, magnetic sensor system 127, other magnetic sensors 125 or data hub 129.

Pose tracker 326 includes a magnetic sensor-based pose tracker 327 that computes body poses for the user based at least on the sensor data generated by magnetic sensors 125. Pose tracker 326 may incorporate, into the pose tracking computation algorithm, the body poses computed by magnetic sensor-based pose tracker 327 to improve an overall rendering of a user avatar in the artificial reality content being rendered by rendering engine 322.

Magnetic sensor-based pose tracker 327 may perform calibration of magnetic sensors 125 of magnetic sensor system 127 to improve an accuracy of body pose tracking. In some examples, magnetic sensor-based pose tracker 327 performs such calibration, in other examples, another component of artificial reality system 1, 2 such as console 106 or magnetic sensor system 127 performs such calibration. For example, console 106 may include a calibration engine configured to calibrate magnetic sensor components 125 of magnetic sensor system 127.

The calibration techniques include intrinsic calibration of magnetic data and inertial measurement unit (IMU) data for each magnetic sensor 125 using distortion and noise modeling that varies according to sensor location on the user's body. The calibration techniques also include fusion of the multi-sensor data, i.e., magnetic and Inertial Measurement Unit (IMU) data, to provide high accuracy results and noise tolerance. In addition, the calibration techniques may include sensor-to-camera system calibration to integrate the magnetic sensors into the HMD camera field of view (FoV) and optic ground truth system calibration. In some examples, sensor-to-skeleton calibration may be performed to enhance body pose tracking accuracy. More specifically, instead of assuming that the magnetic sensors are positioned at a user's joints, e.g., wrists, elbows, shoulders, and hips, the sensor-to-skeleton calibration techniques determine the a more exact location of each of the magnetic sensors with respect to the skeleton or joints of an individual user's body. Once the magnetic sensors are calibrated, the magnetic sensors may be used for body pose tracking in several different artificial reality system use cases. In one use case, the calibrated magnetic sensors may be used in conjunction with or as an alternative to image tracking performed by the HMD in order to continue tracking the user's body even if a portion of the user's body is occluded from the HMD cameras. In another use case, in a mobile setting, the calibrated magnetic sensors may be used alone to infer body pose based on magnetic sensor positions and offsets from predefined body joints. In a further use case, the calibrated magnetic sensors may be used to gather body pose tracking information to build ground truth data for a user agnostic machine learning (ML) model.

Sensor data from magnetic sensor system 127 provided to magnetic sensor-based pose tracker 327 can be used in multiple ways to generate body tracking data. For example, they can be used in combination with other body capture systems (e.g., image capture devices 208, sensors 90 etc.) to help refine the body tracking results to be more accurate. They can also be used in a mobile setting, where the magnetic sensor-based pose tracker 327 infers body pose from the magnetic sensor positions and their relative offsets from predefined body joints. Magnetic sensor-based pose tracker 327 may use magnetic sensor data obtained from each one of magnetic sensor components 125 to compute a location of each magnetic sensor component 125 on the body of the user. For example, magnetic sensor-based pose tracker 327 may maintain a predefined skeletal model that maps respective locations of each magnetic sensor component 125 to the body of the user. Magnetic sensor-based pose tracker 327 uses the magnetic sensor data obtained from each one of magnetic sensor components 125 to determine a position of magnetic sensor components 125 with respect to one or more body parts or joints of the predefined skeletal model. For example, magnetic sensor-based pose tracker 327 uses the magnetic sensor data to compute at least one of a translation or a rotation of each magnetic sensor component 125 with respect to a body joint of the predefined skeletal model. Magnetic sensor-based pose tracker 327 uses the computed location of magnetic sensor components 125 on the body of the user to compute the body pose of the user. For example, by assuming that each magnetic sensor component 125 is positioned at a corresponding joint or body part of the user, magnetic sensor-based pose tracker 327 may use magnetic sensor data to identify a change in position of a magnetic sensor unit 125 and equate the change in position of the body part at which the magnetic sensor unit 125 is positioned.

In some examples, pose tracker 326 computes a body pose of the user by fusing the magnetic sensor data obtained from each magnetic sensor of magnetic sensor components 125 with at least one of IMU data obtained from an IMU of respective magnetic sensor components 125 or with image data obtained from an image capture device integrated within HMD 112 or user device 118. For example, the IMU data may include orientation, acceleration, and latitude data that allows pose tracker 326 to increase the accuracy in the determined locations of magnetic sensor components 125, thereby enhancing the accuracy in pose tracking. Further, pose tracker 326 may use the image data to provide a "ground truth" to validate or verify the determined locations of magnetic sensor components 125. For example, pose tracker 326 may identify a location of a body part of the user depicted in the image data, and use the identified location of the body part to verify a location determined for a corresponding magnetic sensor 125 positioned at the body part. By fusing the magnetic sensor data with the IMU data and/or the image data, pose tracker 326 may perform pose tracking of the user that is robust to many forms of noise and exhibits a high degree of accuracy. In some examples, some or all of the functionality attributed to pose tracker 326, rendering engine 322, and application engine 320 may be performed by user device 300.

Synchronizer 324 of magnetic sensor system 127 may perform sensor synchronization techniques for multiple magnetic sensors 125 positioned at different locations on a body, for accurate body pose tracking in artificial reality (AR) systems. In some examples, synchronizer 324 may be part of a primary magnetic sensor of magnetic sensors 125. In some examples, synchronizer 324 may be part of another component of artificial reality system 1, 2 such as HMD 112, console 106, hub 129, or an independent device (not shown).

The synchronization techniques include managing and sending, by synchronizer 324, a wireless synchronization signal to other magnetic sensors 125 to trigger sensing sampling. A primary magnetic sensor 125 may be mounted to HMD 112. The primary magnetic sensor 125 may generate and send sensor data to wireless data hub 129 that operates as a sensor data collector and sends (directly or indirectly) collected sensor data to console 106 or HMD 112 that may perform pose tracking for the artificial reality system. In some example, wireless data hub 129 may be included with the primary magnetic sensor 125. Each of the other (non-primary) magnetic sensors 125, in response to receiving the wireless synchronization signal, updates its sampling starting clock based on new synchronization timing. If a non-primary magnetic sensor 125 does not receive the wireless synchronization signal, then, based on the previous frame, the non-primary magnetic sensor 125 may estimate a time based on 60 Hz (to give an example frequency). Each of magnetic sensors 125 may send generated sensor data to wireless data hub 129 according to a different schedule to avoid conflicts between the various magnetic sensors 125. If wireless data hub 129 does not receive sensor data from one or more or from all of the magnetic sensors 125, the synchronization process described above may be repeated a number of times, based on an acknowledgement strategy. The number of times may be configurable.

Synchronizer 324 may also perform techniques for synchronizing a magnetic sensor sampling frequency that leverage existing wireless connection protocols to align sensor sampling with an internal system event, e.g., the center of a camera exposure window for image capture device 208 of HMD 112. For example, a primary magnetic sensor of magnetic sensors 125 may receive a trigger signal from HMD 112 and, in response, send a wireless connection request command that comprises a wireless synchronization signal to one or more other magnetic sensors 125 of magnetic sensor system 127. The wireless connection request command may be an initial command, e.g., a connection request or handshake, used to establish or re-establish a wireless communication channel, e.g., Bluetooth, WiFi, or the like, between the primary magnetic sensor and another magnetic sensor. The wireless connection request command is sent by the primary magnetic sensor at a fixed schedule and specifies a start sampling time based on a time at which the other magnetic sensor receives the command. In this way, even though the primary sensor does not know which other sensors 125 are listening, any of the other sensors 125 that receive and respond to the command will align their sampling starting clock with the internal system event. In the case where the internal system event is a camera exposure window, the synchronization techniques described herein may enable the generated sensor data to be associated with a particular image frame captured by image capture device 208 of HMD 112 in order to achieve higher accuracy body pose tracking.

In some examples, some or all of the functionality attributed to pose tracker 326, rendering engine 322, and application engine 320 may be performed by HMD 112.

Figure 4:
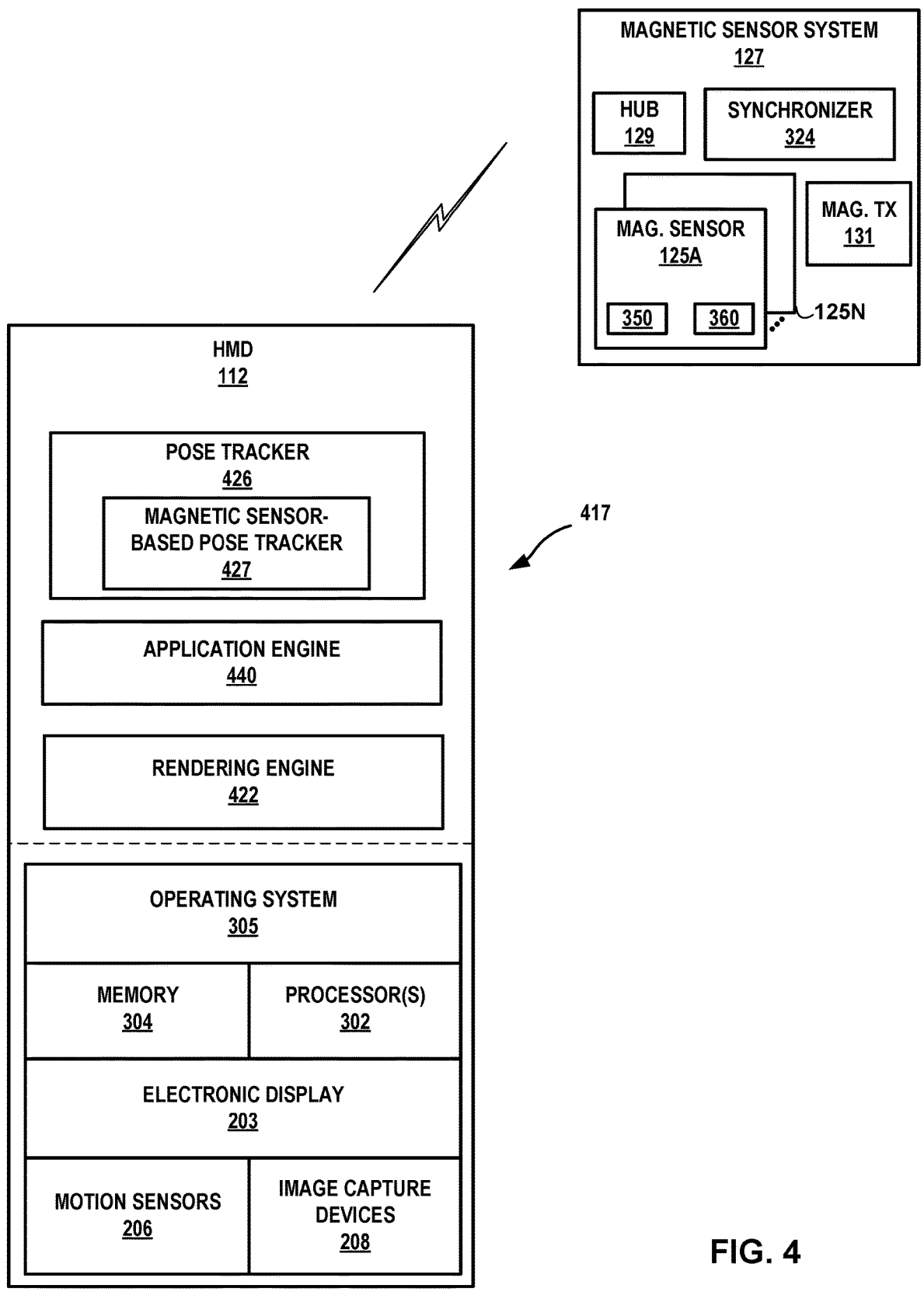
FIG. 4 is a block diagram depicting an example of a magnetic sensor system and a user device for an artificial reality system, in accordance with techniques of this disclosure.

FIG. 4 is a block diagram depicting an example of a magnetic sensor system 127 and an HMD 112 for an artificial reality system, in accordance with techniques of this disclosure. In the example illustrated in FIG. 4, HMD 112 operates as a stand-alone device, i.e., is not tethered to a console. In this example, similar to FIG. 3, HMD 112 includes one or more processors 302 and memory 304 that, in some examples, provide a computer platform for executing an operation system 305, which may be an embedded, real-time multitasking operating system. In turn, operating system 305 provides an operating environment for executing one or more software components 417. Moreover, processor(s) 302 are coupled to electronic display 203, motion sensors 206, and image capture devices 208.

In the example of FIG. 4, software components 417 operate to provide an overall artificial reality application. In this example, software components 417 include application engine 440, rendering engine 422, and pose tracker 426. In various examples, software components 417 operate similar to the counterpart components 317 of console 106 of FIG. 3 (e.g., application engine 320, rendering engine 322, and pose tracker 326).

HMD 112 includes a pose tracker 426 that may include a magnetic sensor-based pose tracker 427, which performs operations similar to those described with respect to magnetic sensor-based pose tracker 327 of FIG. 3. Pose tracker 426 may incorporate, into the pose tracking computation algorithm, the body poses computed by magnetic sensor-based pose tracker 427 and other sensor and image capture data to improve an overall rendering of a user avatar in the artificial reality content being rendered by rendering engine 422.

Figure 5:
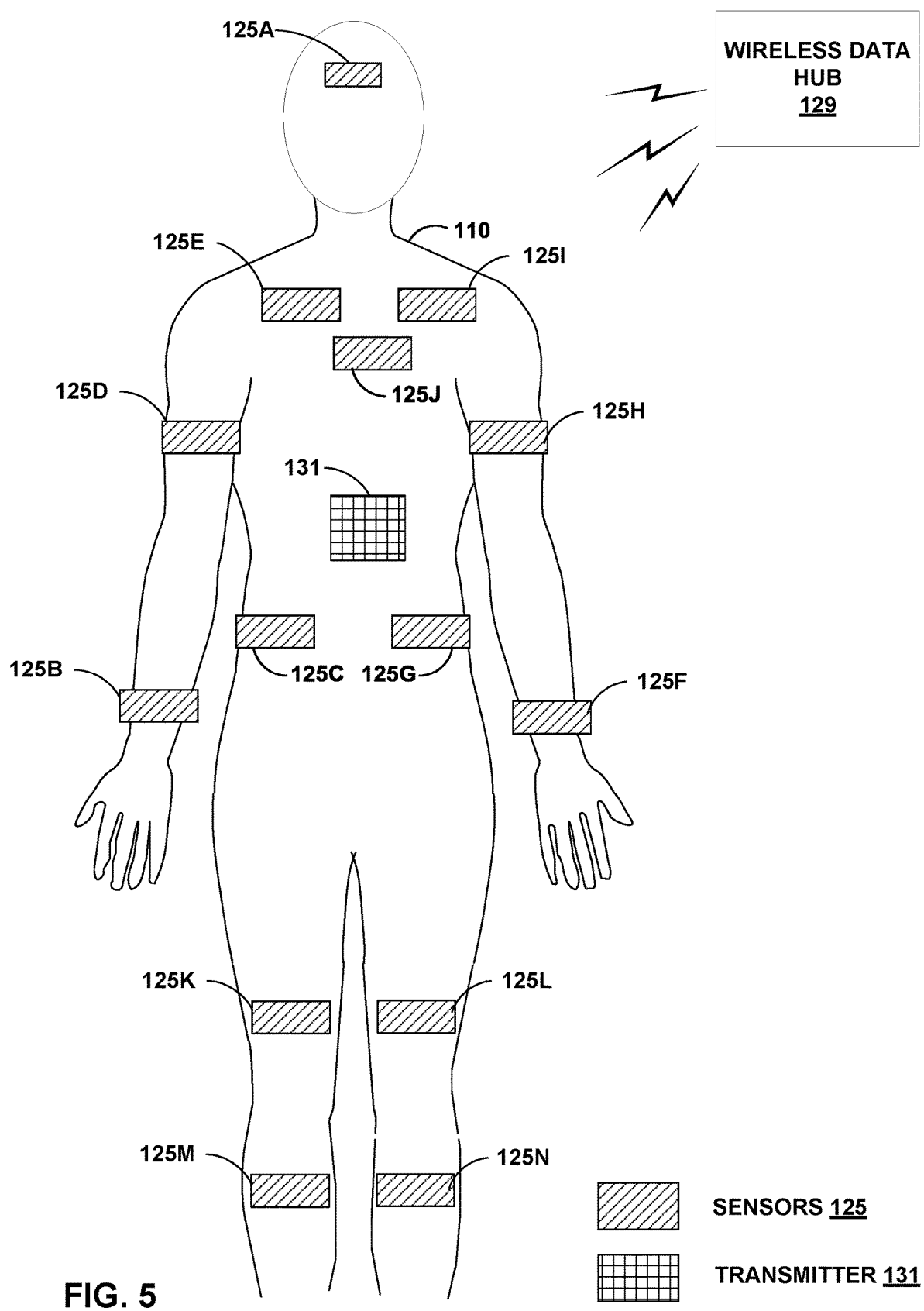
FIG. 5 is an illustration depicting an example configuration of a magnetic sensor system in accordance with the techniques of the disclosure.

FIG. 5 is an illustration depicting an example configuration of magnetic sensor system 127 in accordance with the techniques of the disclosure. Magnetic sensor system 127 includes a plurality of magnetic sensors 125A-125N (collectively, "magnetic sensor components 125") and magnetic transmitter 131. Magnetic sensor system 127 operates in conjunction with wireless data hub 129, console 106 and/or HMD 112 in a substantially similar fashion as described above with respect to FIGS. 3 and 4.

As depicted in FIG. 5, each magnetic sensor 125 of magnetic sensor system 127 is spatially arranged so as to position each magnetic sensor 125 at a different location of a body of a user. As described in more detail with respect to FIG. 6, one or more wearable articles (not depicted in FIG. 5) may spatially arrange magnetic sensors 125 and magnetic transmitter 131 by affixing magnetic sensors 125 and magnetic transmitter 131 at one or more locations of a body of the user, such as a head (e.g., magnetic sensor 125A), left and right forearms (e.g., magnetic sensors 125B and 125F), left and right upper arms (e.g., magnetic sensors 125D and 125H), left and right sides of a hip (e.g., magnetic sensors 125C and 125G), left and right shoulders (e.g., magnetic sensors 125E and 125I), and upper front center of the torso (e.g., magnetic sensor 125J). In other examples, magnetic sensors 125 may be positioned at an upper left and right leg (e.g., magnetic sensors 125K and 125L, and a lower left and right leg (e.g., magnetic sensors 125M and 125N. In further examples, magnetic sensors 125 may be positioned at other locations of the body of the user, such as a wrist, an elbow, an upper arm, a neck, a torso, a waist, a knee, an ankle, or a foot. As depicted in the example of FIG. 5, each magnetic sensor 125 is positioned on a location on the body of the user that is different from the location at which magnetic transmitter 131 is positioned on the body of the user and each other magnetic sensor 125. As described in more detail below, in some examples, one or more wearable articles (e.g., a vest, a shirt, a jacket, arm bands, and/or chest bands) provide structural support for magnetic sensors 125 and magnetic transmitter 131 to stabilize magnetic sensors 125. By providing rigid structural support for magnetic sensors 125 and magnetic transmitter 131, the one or more wearable articles may avoid impeding movement of the user. Furthermore, the rigid structural support provided by the one or more wearable articles may reduce noise in the magnetic sensor data generated by magnetic sensor system 127 that may otherwise occur due to vibration or shifting of a position of the components of magnetic sensor system 127 during movement of the user.

Figure 6:
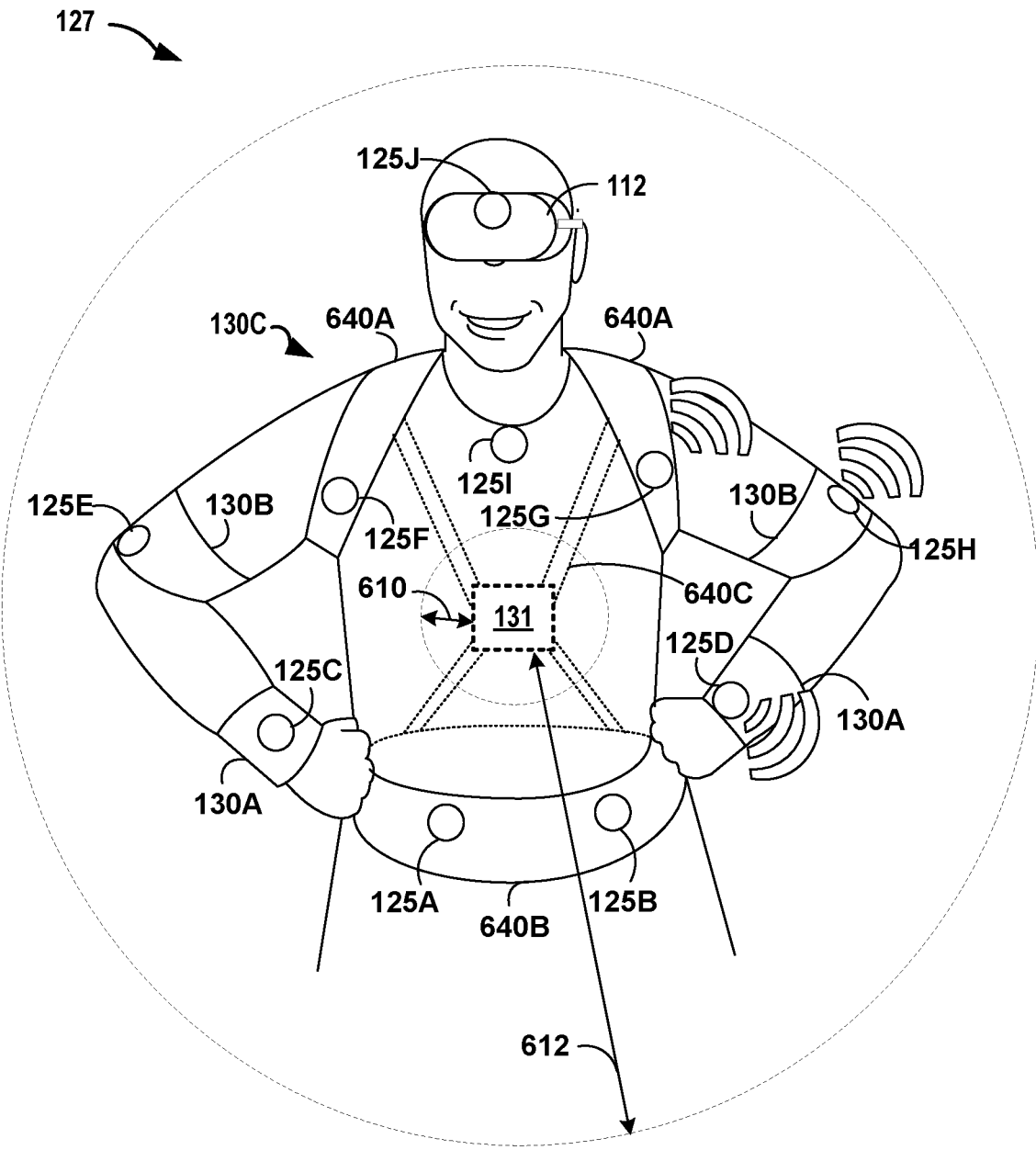
FIG. 6 depicts a user wearing a magnetic sensor system including multiple magnetic sensors mounted to wearable components, including a backpack with shoulder and hip straps, arm bands, and wrist bands.

FIG. 6 is an illustration depicting an example spatial arrangement of components within wearable articles 130A-130E (hereinafter, "wearable articles 130") of magnetic sensor system 127 in accordance with the techniques of the disclosure. Magnetic sensor system 127 includes a plurality of magnetic sensor components 125 and magnetic transmitter 131. Magnetic sensor system 127 operates in a substantially similar fashion as described above with respect to FIG. 1.

In the example of FIG. 6, a user wears multiple wearable articles 130 that affix multiple magnetic sensors 125A-125J and magnetic transmitter 131 around a torso of the user. For example, wearable articles 130 may affix each of magnetic sensors 125 at different body joints of a plurality of different body joints of the user. As depicted in the example of FIG. 6, wearable articles 130 include each of wrist bands 130A, elbow bands 130B, and a harness backpack 130C comprising shoulder harnesses 640A, belt 640B, and rear straps 640C. Each of wrist bands 130A, elbow bands 130B, and shoulder harnesses 640A mount one of magnetic sensors 125. Belt 640B mounts two magnetic sensor component 125. Further, harness backpack 130C may affix magnetic transmitter 131 at a back of the user (as depicted by the dotted lines of FIG. 6) via rear straps 640C. Furthermore, harness backpack 130C affixes magnetic sensors 125I to an upper center of a front torso of the user. Alternatively, a wearable article 130 may affix magnetic transmitter 131 and/or magnetic sensors 125 at other locations around the torso of the user. Other types of wearable articles may be used in addition to, or in alternative to, wearable articles 130 depicted in FIG. 6.

In some examples, at least one wearable article is configured to be worn on one or more body parts of the user, such as around a neck, arms, legs, head, torso, or waist of the user, etc. For example, as discussed above, wearable articles 130 may include a backpack with shoulder and hip straps, arm bands, and wrist bands. Other types of wearable articles may be used, for example, a jacket, vest, coat, shirt, hat, pants, shoes, a belt, a harness, one or more clips that attach to clothing of the user, or other type of device wearable by the user.

While in the example of FIG. 6, the user wears multiple wearable articles 130, each of which mounts one or more sensors 125, in other examples, the user wears a single wearable article 130 (e.g., a full-body suit or harness) that mounts all of magnetic sensors 125 and magnetic transmitter 131. For example, a wearable article 130 may comprise a single unit, e.g., a jacket, vest, harness, or backpack, that mounts magnetic transmitter 131 around a torso of the user and a power source (not depicted) on a back of the user. In addition, the single wearable article 130 may spatially arrange a plurality of magnetic sensors 125 around the torso of the user at locations different from the magnetic transmitter 131, the power source, and each of the other magnetic sensors 125. The wearable article spatially arranges magnetic sensors 125 around the torso of the user such that magnetic sensor data obtained from magnetic sensors 125 may be used for body pose tracking of the user.

Typically, each magnetic sensor component 125 is affixed at a location on the body of the user that is within signal range 612 of the magnetic transmitter. For example, where signal range 612 of magnetic transmitter 131 is approximately 1 meter, each magnetic sensor component 125 is affixed at a location on the body of the user that is within 1 meter of magnetic transmitter 131. Additionally, each magnetic sensor component 125 is affixed at a location on the body of the user that is outside of a noise range 610 at which magnetic transmitter 131 may cause interference to magnetic sensor component 125. For example, magnetic sensors 125 may receive interference, noise, or otherwise behave in an undesired or unpredictable manner when located less than approximately 10 centimeters from magnetic transmitter 131. Accordingly, each magnetic sensor component 125 is affixed at a location on the body of the user that is at least 10 centimeters away from magnetic transmitter 131. As depicted in the example of FIG. 6, each magnetic sensor component 125 is affixed at a location on the body of the user that is outside of noise range 610 and inside of signal range 612. For example, each of magnetic sensors 125 is affixed at a location on the body of the user that is more than about 10 centimeters and less than about 1 meter from the location at which magnetic transmitter 131 is affixed at the body of the user.

Each wearable article may affix a magnetic sensor component 125, magnetic transmitter 131, or a power source (not depicted in FIG. 6) via various types of attachment devices integrated into wearable articles 130. For example, harness 130C includes a transmitter attachment mechanism configured to affix magnetic transmitter 131 at a location on the torso of the user. For example, harness 130 may include sewn fabric that encapsulates magnetic transmitter 131 on a back of the user (as depicted by the dashed lines of magnetic transmitter 131 in FIG. 7) and one or more rear straps 640C that position magnetic transmitter 131 at a location on the torso of the user.

Each of wearable articles 130A, 130B, and 130C include at least one receiver attachment mechanism spatially arranged within the respective wearable article 130 that affixes one or more magnetic sensors 125 at respective different locations around the torso of the user. In examples where a wearable article 130 includes a power source or battery (not depicted in FIG. 6), wearable article 130 may include a power source attachment mechanism configured to affix the power source at a location on the torso of the user that is different than the location of magnetic transmitter 131 and the locations of each of the plurality of magnetic sensors 125. Various types of attachment mechanisms may be used to affix the various components of magnetic sensor system 127 at positions on the body of the user. For example, wearable articles 130 may include one or more hook-and-loop fasteners, clips, sewn pockets, button fasteners, ties, clasps, straps, or laces. For example, each wearable article 130 may include a sewn loop of elastic fabric that anchors the various components of magnetic sensor system 127 to the wearable article 130.

Each of the transmitter attachment mechanism, receiver attachment mechanisms, and the power source attachment mechanism may be similar or different types of attachment mechanisms. Further, each attachment mechanism may be permanent or removable. For example, the transmitter attachment mechanism or receiver attachment mechanism may enclose magnetic transmitter 131 or one of magnetic sensors 125 in a permanent, sewn enclosure of a wearable device 130. As another example, each of the transmitter attachment mechanism or receiver attachment mechanism may be a removable fastener that facilitates convenient removal and replacement of one of magnetic transmitter 131 or magnetic sensors 125.

FIGS. 7A-7D are illustrations depicting example wearable articles 130 of a magnetic sensor system 127 from different views in accordance with the techniques of the disclosure. Specifically, FIGS. 7A-7D depict wearable articles 130 of FIG. 6 in different poses from different perspectives. As can be seen in this depiction, a backpack wearable component 130E has affixed thereto magnetic transmitter 131 located at the lower back of the user and power source 704 (e.g., a battery component) located between the shoulder blades.

Each wearable article 130 comprises a relatively rigid structure that stabilizes magnetic sensor components 125 without inhibiting movement by the user. In addition, each wearable article 130 may be constructed to hold the components of magnetic sensor system 127, such as magnetic sensor components 125, magnetic transmitter 131, and battery component 704, on the user's body with appropriate weight distribution to facilitate user comfort. For example, wearable article 130E affixes the magnetic transmitter 131 at a position close to a center of a mass of the user, such as at a position at the small of the back of a user, so as to reduce discomfort and fatigue in the user. In some examples, wearable articles 130 are constructed from a strong material that is form-fitting to a skin of the user, such as silicone. In some examples, wearable articles 130 include a silicone supportive member that rests against a skin of the user. The wearable articles 130 further include an elastic synthetic fabric that attaches to the silicone supportive member and provides a mechanism to hold the components of magnetic sensor system 127.

Figure 7A:
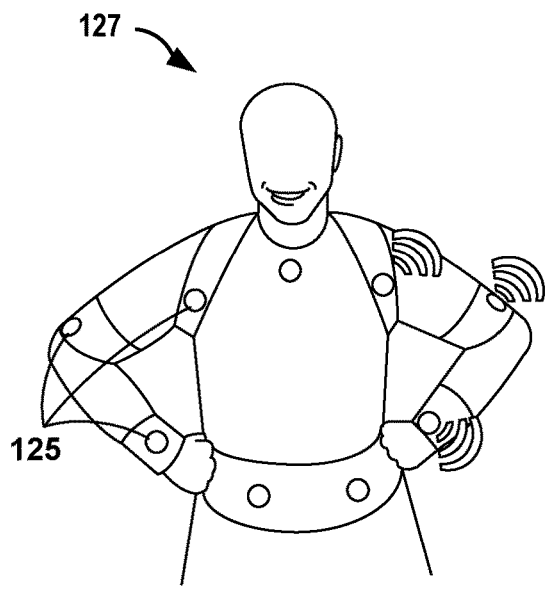
FIGS. 7A-7D are illustrations depicting example wearable articles of a magnetic sensor system from different views in accordance with the techniques of the disclosure.
Figure 7B:
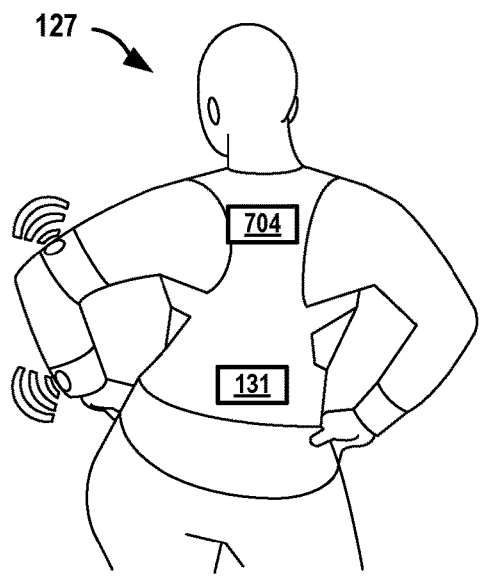
Figure 7C:
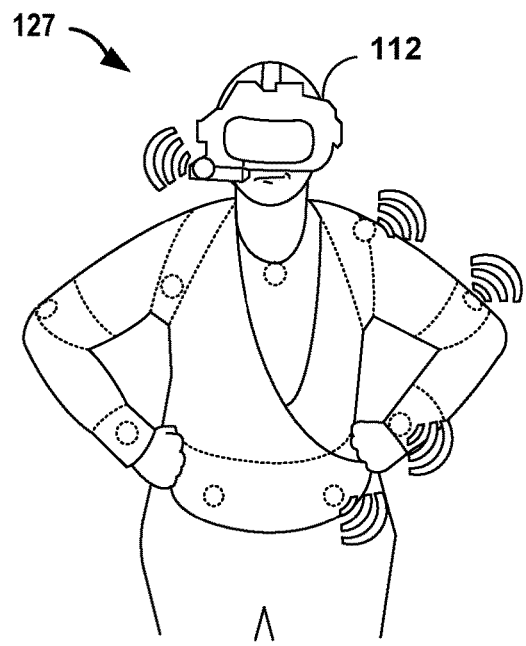
Figure 7D:
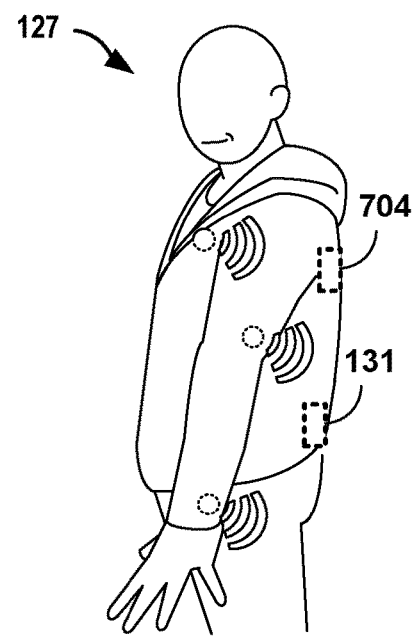

As depicted in FIGS. 7C and 7D, magnetic sensor components 125 may be small and may be hidden underneath the clothes of the user without introducing visual bias to image capture devices during data collection. Magnetic sensor data may be processed to determine an orientation and position of the corresponding magnetic sensor components 125, with little or no affect by line-of-sight considerations, in contrast to conventional techniques that use infrared or visible light tracking. As discussed in more detail below with respect to FIG. 8, the magnetic sensor system 127 of FIG. 7C may include at least one magnetic sensor components 125 incorporated into an HMD 112.

Figure 8:
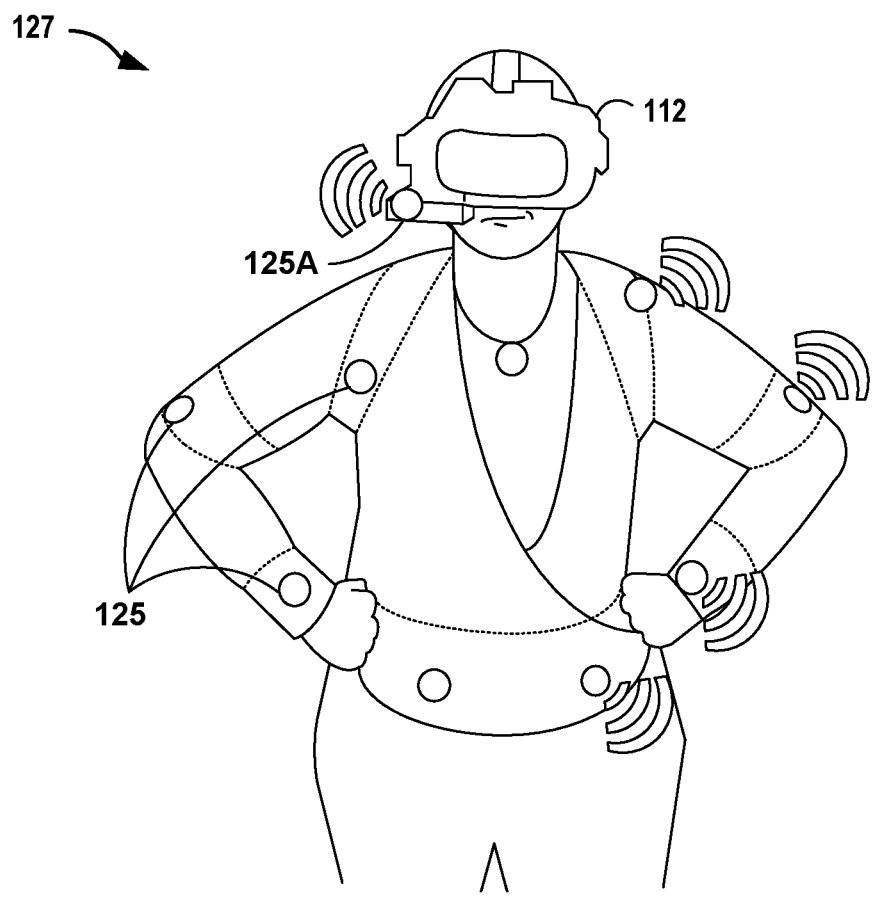
FIG. 8 is a conceptual diagram illustrating an example configuration of wired and wireless connections between sensor components in a magnetic sensor system and an internal system or HMD, according to techniques of this disclosure.

FIG. 8 is an illustration depicting example wearable articles 130 that include magnetic sensor system 127 and HMD 112 in accordance with the techniques of the disclosure. In the example of FIG. 8, HMD 112 may additionally include a magnetic sensor component 125A that operates in a substantially similar fashion as magnetic sensors 125. In one example, magnetic sensor component 125A is connected to HMD 112 via a wired connection, while the other magnetic sensors 125 are connected to HMD 112 via wireless connections. In some examples, magnetic sensor 125A may be a "main" or "primary" magnetic sensor that coordinates timing synchronization with each other magnetic sensor component 125 of magnetic sensor system 127. For example, magnetic sensors 125 and 125A may operate in conjunction with one another to generate magnetic sensor data and wirelessly send the magnetic sensor data to data hub 129 of FIG. 1. In some examples, magnetic sensor 125A performs periodic timing synchronization with each other magnetic sensor 125 of magnetic sensor system 127. In some examples, the wireless link between each of magnetic sensor 125 and magnetic sensor 125A is on a different wireless channel to minimize wireless link packet drop. In some examples, magnetic sensor 125A broadcasts a synchronization signal to each of magnetic sensors 125. Magnetic sensor 125A may transmit the synchronization signal to magnetic sensors 125 using a wireless communication protocol, such as Bluetooth®, IEEE 802.11, etc.

Image data provided by an image capture device of HMD 112 may be used to provide a "ground truth" to validate or verify the determined locations of magnetic sensors 125. For example, a location of a body part of the user depicted in the image data may be used to verify a detected location of a corresponding magnetic sensor 125 affixed at the body part. By fusing the magnetic sensor data with the image data, pose tracker 326 may perform pose tracking of the user that is robust to many forms of noise and exhibits a high degree of accuracy.

Figure 9:
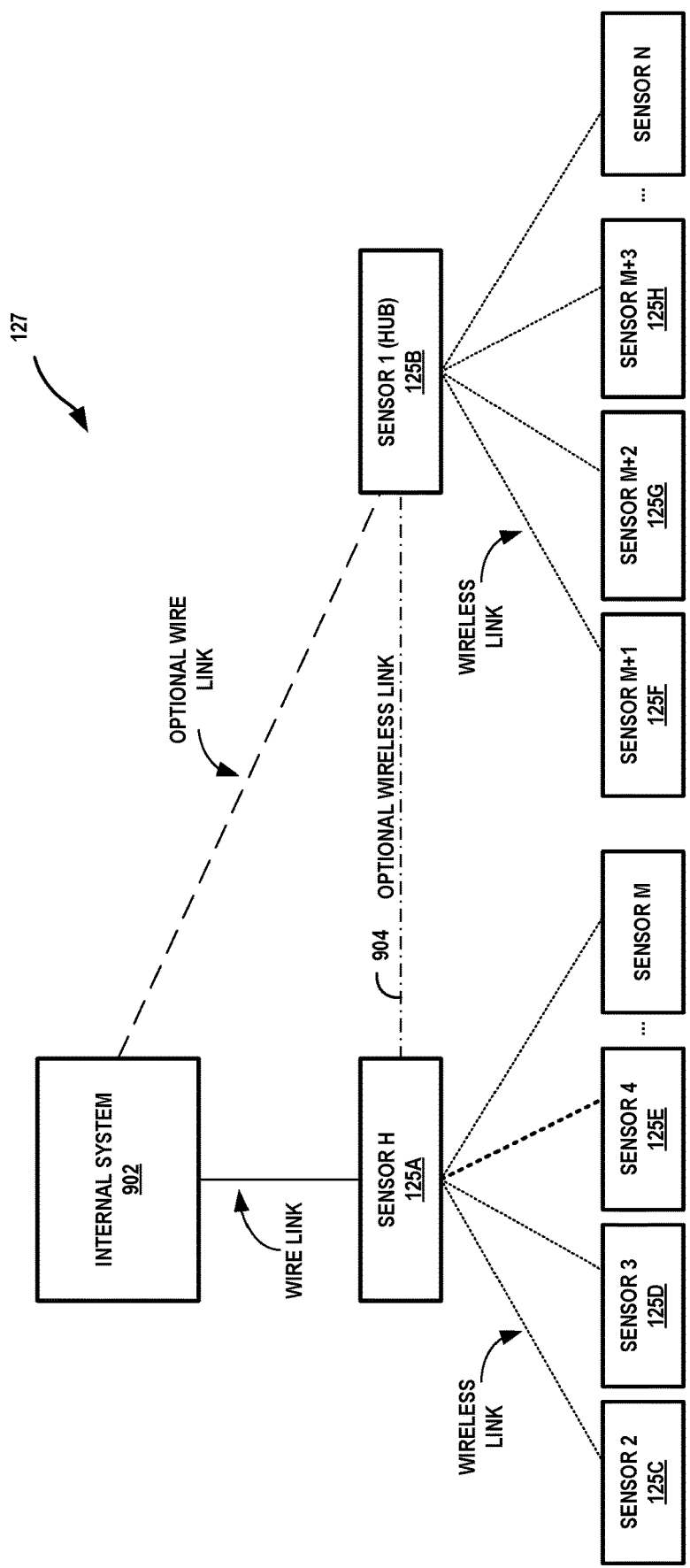
FIG. 9 illustrates example data flow of sensors to be synchronized in accordance with the techniques of the disclosure.

FIG. 9 is a conceptual diagram illustrating an example configuration of wired and wireless connections between components in a magnetic sensor system 127 and an internal system 902, according to techniques of this disclosure. Magnetic sensor system 127 may be configured to perform techniques for enabling simultaneous operation of multiple primary magnetic sensors of magnetic sensors 125 in magnetic sensor system 127 in which each of the primary magnetic sensors is configured to manage synchronization of sampling frequency for discrete groups of other magnetic sensors 125 in the magnetic sensor system 127. In this way, the number of magnetic sensors used for body pose tracking may be increased while avoiding bandwidth issues. In one example, each of the primary magnetic sensors may have a wired connection with HMD 112 and send a wireless synchronization signal to its group of non-primary magnetic sensors 125 in response to a trigger signal received from HMD 112. In another example, a first primary magnetic sensor may have a wired connection with HMD 112 to receive the trigger signal and have a wireless connection with a second primary magnetic sensor as one sensor in a first group of magnetic sensors 125 managed by the primary magnetic sensor. In response to a wireless connection request command received from the first primary magnetic sensor, the second primary magnetic sensor manages synchronization of sampling frequency for a second group of magnetic sensors 125 in the magnetic sensor system 127.

A first primary magnetic sensor 125A (referred to as "Sensor H") may have a wire link connection with internal system 902 (e.g., HMD 112 or console 106) to receive a trigger signal to initiate a sample from sensors 125. In the example configuration shown in FIG. 9, Sensor H may be the host of the entire wireless system of magnetic sensors 125, etc., or Sensor H may be the host of a portion of the wireless system of magnetic sensors 125 comprising a first discrete group of sensors 2–m. As illustrated, another magnetic sensor 125B (e.g., sensor 1) may operate similar to Sensor H as a second primary magnetic sensor. Sensor 1 may be the host of a portion of the wireless system comprising a second discrete group of sensors m+1–n. Sensor 1 may or may not have a wired link connection (i.e., optional wire link) with internal system 902 to receive the trigger signal directly from internal system 902.

The network between Sensor H and sensors 1-to-n may be a one-to-many network or may be a mesh network. In the illustrated example of FIG. 9, Sensor H may be wirelessly connected to a first group of sensors (e.g., sensor 1 and sensors 2–m), and sensor 1 may be wirelessly connected to a second group of sensors (e.g. sensors m+1–n and Sensor H). The wireless communication channel established by Sensor H with the magnetic sensors in the first group may be different than the wireless communication channel established by sensor 1 with the magnetic sensors in the second group, so the communication between the sensors in the first group and the communication between the sensors in the second group operate independently. If established, the wireless communication channel between Sensor H and sensor 1 (i.e., optional wireless link 904), may operate as yet another communication channel that is different than the communication channel of the first group or the second group.

In the example illustrated in FIG. 9, there are two groups of magnetic sensors. However, the magnetic sensor network may be extended into more than two groups. For example, there may be n magnetic sensors divided into n/y groups such that each group may have y magnetic sensors. In some aspects, magnetic sensors within a group can communicate with a lead (e.g., primary) sensor for the group. The lead sensor for each group may report sensor data to internal system 902.

Figure 10:
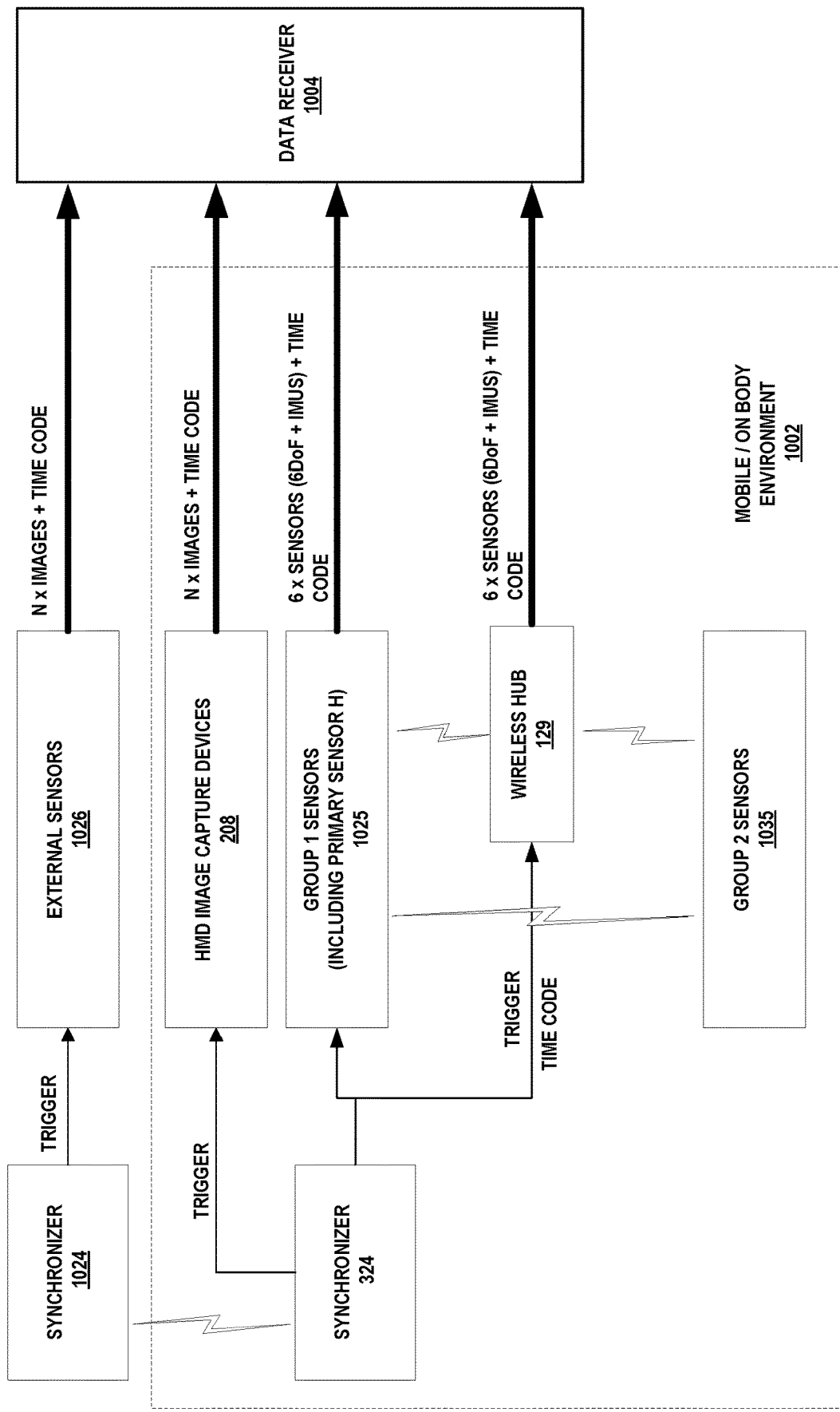
FIG. 10 is a block diagram illustrating a synchronization path and data flow of a magnetic sensor system 126 configured as described above in FIG. 9 according to techniques of the disclosure.

FIG. 10 is a block diagram illustrating a synchronization path and data flow of a magnetic sensor system 126 configured as described above in FIG. 9 according to techniques of the disclosure. In some aspects, synchronizer 324 (FIGS. 3, 4) supplies a trigger indication to HMD image capture devices 208, primary magnetic sensor 125A (Sensor H) of group 1 sensors 1025 (e.g., sensors 1–m of FIG. 9), and wireless hub 129 (or second primary magnetic sensor configured as a wireless hub) of group 2 sensors 1035 (e.g., sensors m+1–n of FIG. 9). In response to receiving the trigger indication, the HMD 112 image capture devices 208 capture image data corresponding to the physical environment in the field of view of the image capture devices. In some aspects, in response to receiving the trigger indication, primary magnetic sensor 125A sends a synchronization signal to each of the group 1 sensors 1025 and waits to receive sensor data from the group 1 sensors 1025. In some aspects, wireless hub 129 (or sensor 1 acting as a wireless hub 129) sends a synchronization signal to each of the group 2 sensors 1035 and waits to receive sensor data from the group 2 sensors 1035.

Image capture device 208 of HMD 112 may send image capture data to data receiver 1004. There may be one image per each of the n image capture devices on the HMD 112. Additionally, primary magnetic sensor 125A may send sensor data sampled by the primary magnetic sensor 125A and other group 1 sensors 1025 to data receiver 1004. Further, wireless hub 129 (or sensor 1 acting as a wireless hub 129) may send sensor data sampled by group 2 sensors 1035 to data receiver 1004.

In some aspects, synchronizer 324, image capture devices 108, group 1 sensors 1025, group 2 sensors 1035 and wireless hub 129 may be part of a mobile or on/body environment 1002. In such aspects, data receiver 1004 may be a pose tracker 326, 426 and/or magnetic sensor post tracker 327, 427 (FIGS. 3, 4).

In some aspects, a synchronizer 1024 may send a trigger signal at the same time as the trigger signal issued by synchronizer 324. Synchronizer 1024 may send the trigger signal to external sensors 1026. External sensors 1026 may be any of external sensors 90 (FIG. 1). Further, external sensors 1026 may be motion capture devices, Kinect cameras, or other types of sensors. In response to receiving the trigger signal, external sensors 1026 may provide data to data receiver 1004. In some aspects, data receiver 1004 can be a pose tracker 326, 426 and/or magnetic sensor post tracker 327, 427 (FIGS. 3, 4). In some aspects, data receiver 1004 may be a machine learning system configured to analyze the received data. For example, the machine-learning system may be used to calibrate the magnetic sensors 125 with other sensor data such as data from external sensors 90 or pose data determined based on image capture devices 208.

Figure 11:
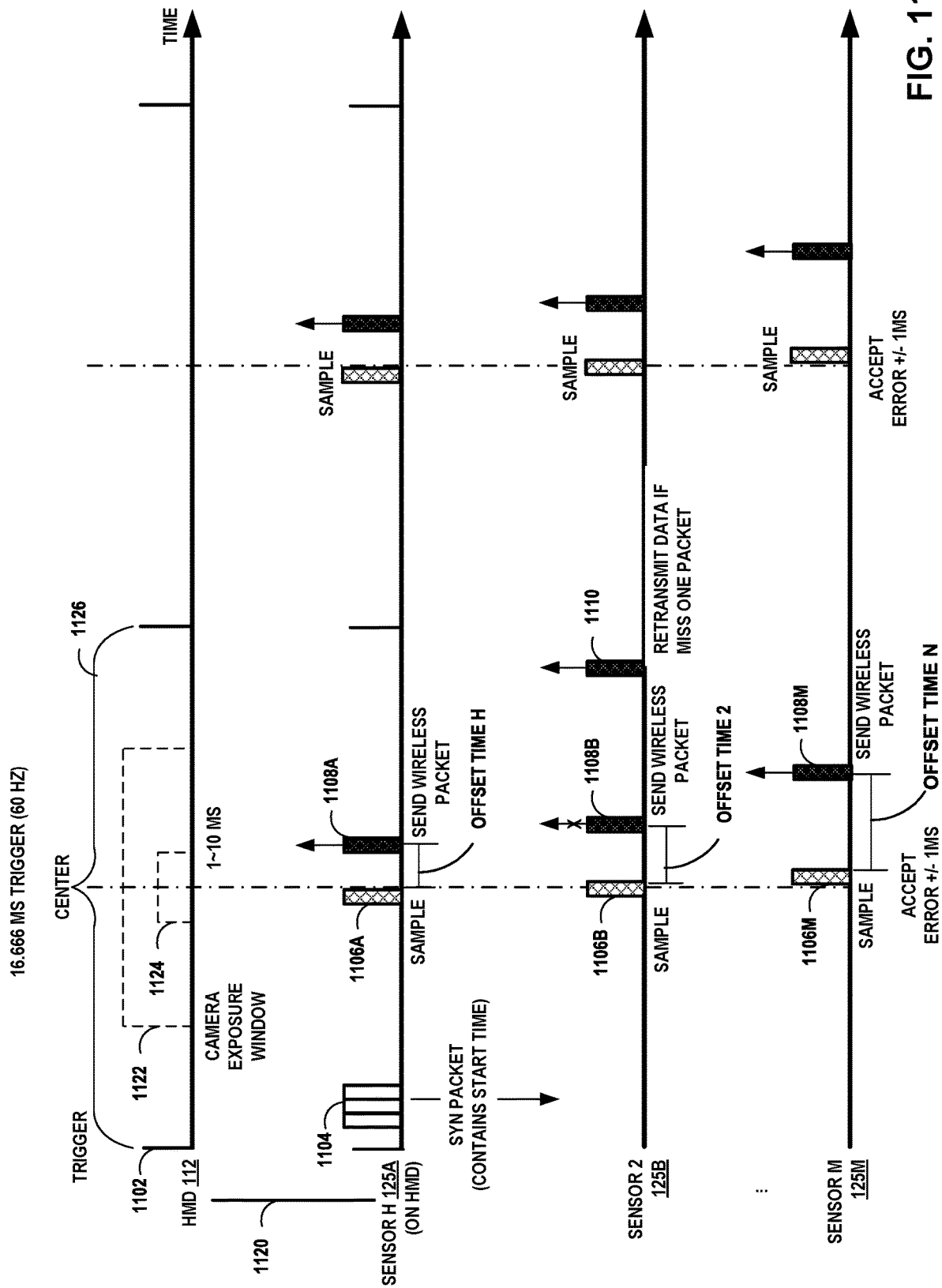
FIG. 11 is a conceptual diagram illustrating a synchronization design for synchronizing magnetic field sampling by magnetic sensor components, according to techniques of this disclosure.

FIG. 11 is a conceptual diagram illustrating a synchronization strategy for synchronizing magnetic field sampling and wireless data transmission by magnetic sensor components. HMD 112 may send an indication of a trigger 1102 to a primary magnetic sensor (e.g., a magnetic sensor 125A on HMD 112). The timing of trigger 1102 may be based on an event such as a camera exposure window of one or more cameras (e.g., image capture devices 208 (FIGS. 2A and 2B)). In response to receiving the indication of the trigger 1102, a primary magnetic sensor 125A (Sensor H) may issue a SYN packet 1104, which may include a start time. Based on the start time, each of the magnetic sensors 125 samples 1106 the corresponding magnetic field at substantially the same time (e.g., +/−1 ms) within a sampling window 1124 and generates corresponding sensor data. Within a transmission window specified for each magnetic sensor 125, the magnetic sensor 125 sends a wireless packet 1108 including its corresponding sensor data for the frame to the primary magnetic sensor 125A (Sensor H). Each magnetic sensor 125 can be configured with a different transmission window per frame 1126. In some aspects, the transmission window for a packet may be specified as an offset time from the start time or from the time a sample is taken by the magnetic sensor 125. The magnetic sensor 125 may attempt to retransmit 1110 in case of packet loss. For example, a magnetic sensor 125 may retransmit a packet if the magnetic sensor fails to receive an acknowledgment of a prior packet. The sampling time may be based in part on a camera (image capture device) exposure window 1122 of HMD 112. For instance, the sampling may be directed to occur in the center of the exposure window 1122. The sampling frequency may run at 60 Hz by default, resulting in a frame length of 16.666 milliseconds. However, the sampling frequency may be another frequency, or may be triggered at another frequency according to any criteria by the HMD 112. In some examples, HMD 112 may be connected by a wire or wireless connection 1120 to the primary magnetic sensor 125A (Sensor H) for triggering or other synchronization with an HMD-driven timing scheme.

The description above has been provided in the context of a single primary magnetic sensor 125A (Sensor H). The same synchronization scheme may be applied in the context of a second primary magnetic sensor (e.g., sensor 1 125B or other device acting as a wireless hub 129) with respect to sensors associated with the second primary magnetic sensor (e.g., sensors m+1–n of FIG. 9).

Figure 12:
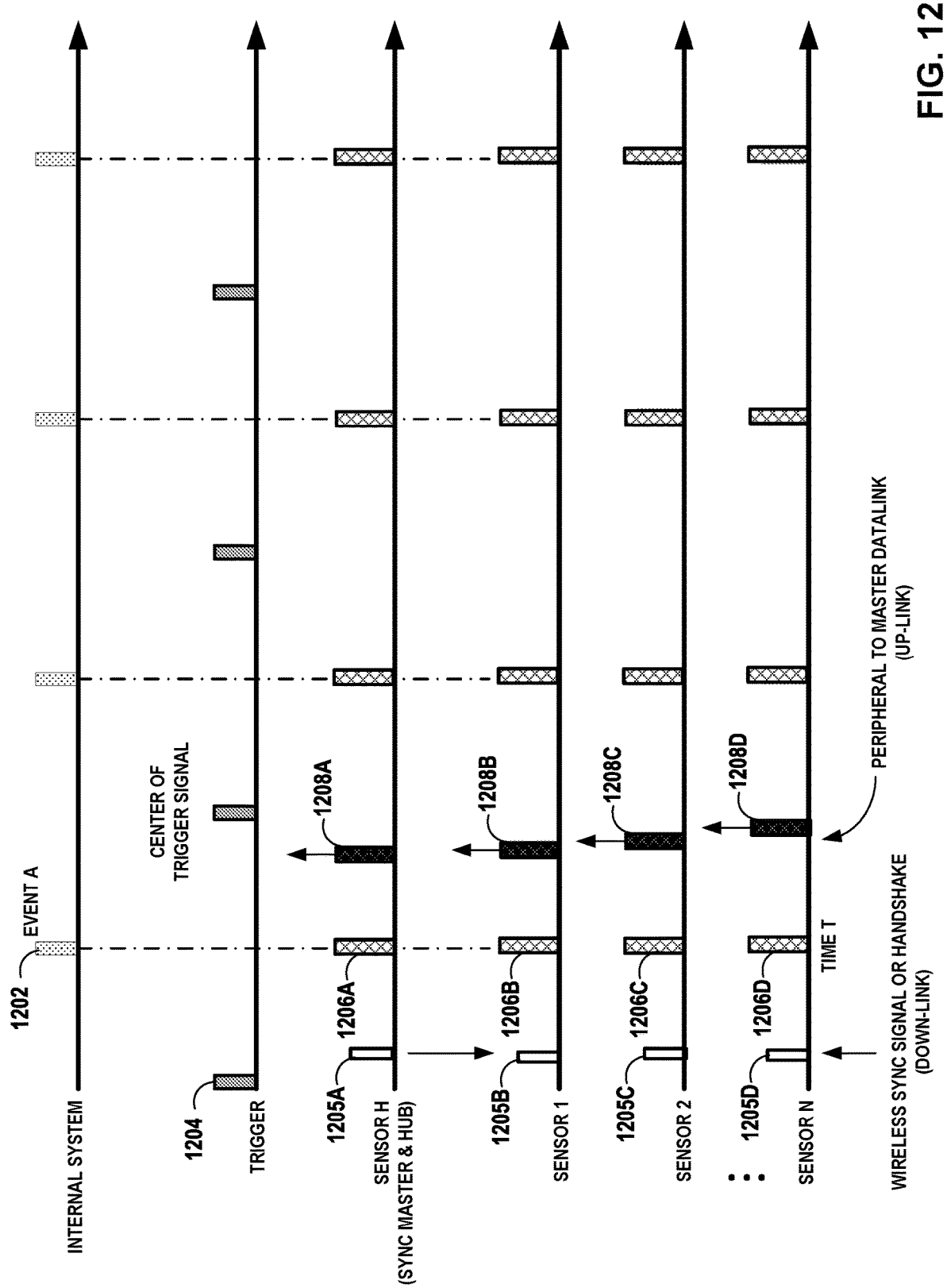
FIG. 12 is a conceptual diagram illustrating a synchronization design for synchronizing magnetic field sampling frequency by magnetic sensor components, according to techniques of this disclosure.

FIG. 12 is a conceptual diagram illustrating a synchronization design for synchronizing magnetic field sampling frequency by magnetic sensor components, according to techniques of this disclosure. An initialization of synchronization between Sensor H and sensors 1–n may happen after Sensor H receives the trigger signal 1204 from an internal system (e.g., HMD 112, console 106 etc.). The initialization of the synchronization event may happen during wireless connection setup (i.e., Sensor H sending wireless connection requests to the other magnetic sensors 125 at 60 Hz and synced with a trigger signal) or after the wireless connection setup has finished. In some aspects, the wireless connection setup occurs when two devices (e.g., a primary magnetic sensor such as Sensor H and a non-primary magnetic sensor 125) establish a pairing or connection. For example, wireless connection setup can refer to an event defined by an existing wireless protocol (e.g., a connection request or handshake defined by Bluetooth, WiFi, or the like). Each sensor 1–n may be configured with a different wireless channel or a different time to report data to the wireless data hub. The channel and reporting time can be configured based on the number of magnetic sensors connected to magnetic sensor system 127 and the wireless protocol used to communicate sensor data. In some aspects, the connection request or handshake may be a connection request or handshake that is modified to deviate from the Bluetooth, WiFi or other communication standard.

As one example, a CONNECT_REQ command 1205 (i.e., the wireless connection request defined by Bluetooth) may be sent from the primary magnetic sensor or host (e.g., Sensor H) to each of the other sensors 1–n as the wireless synchronization signal. A Connection Establishment ACK may be received by Sensor H from one or more of the other sensors to confirm the wireless connection and the synchronization. After a given one of the other sensors, e.g., sensor 2, receives the CONNECT_REQ command 1205B at time $T_s$, sensor 2 will start sampling 1206B at the start sampling time specified in the CONNECT_REQ command 1205B. For example, in examples where an event 1202 occurs at a frequency of 60 hz (e.g., every 16.666 milliseconds) sensor 2 may start sampling at $T_s$+m*8.3333 ms+delT−offset, where n is even for 60 Hz sampling, m can be any integer, delT is an acceptable time tolerance (+/−0.1 to +/−0.5 ms, and no drift over +/−1 ms offset), and offset is a design choice based on a measurement or may be sent from Sensor H after initial calibration. A data packet 1208B including the sensor data sent by sensor 2 to the wireless data hub may include the index (e.g., i=0 to 255) starting from time T=Ts+n*8.333 ms+delT−offset. In some aspects, the CON-NECT_REQ command 1205 may be sent by Sensor H at a fixed frequency, e.g., 60 Hz, which is triggered by the trigger signal from the internal system. In some aspects, a different frequency may be used.

Sensor H may periodically send synchronization data S, either as part of the wireless connection command of the wireless protocol or as an independently transmitted packet, to all sensors 1–n according to a fixed frequency (e.g., every ~x seconds). Synchronization data S may be a single byte or multiple bytes of data indicating the index of the data packet including the sensor data to be sent by each sensor 1–n. Once a given sensor, e.g., sensor 2, receives synchronization data S, sensor 2 may align its sensor start sampling time at Ts+n*8.3333 ms+delT−offset, and mark that sample as index S. The data S may be aligned with or included in any receiving acknowledge command of the wireless protocol, and the offset may be sent from Sensor H or computed by each of sensors 1–n. Sensors 1–n may reply with synchronization acknowledge data any time after received the synchronization data. The acknowledgement data may be packaged with the sensor data or sent as an independent transmitted packet.

Sensors 1–n may each report a single packet according to the operating frequency, e.g., 60 HZ, or report Y packets at a time when bandwidth is limited (e.g., the report rate may be 30 Hz). Sensors 1–n may be roughly synced so the report of packets may happen at different time slots within different groups of sensors (e.g., group 1 sensors 1025 and group 2 sensors 1035 of FIG. 10). The report of packets may happen at similar timing between two groups.

If any of sensors 1–n does not receive a synchronization signal, the given sensor may continue sampling at a fixed default frequency (e.g., 60 Hz or 120 Hz) based on its local clock. The given sensor may only adjust or correct its clock counting when the synchronization signal data S is received.

The wireless sync signal illustrated in FIG. 12 may be a protocol event (e.g., a connection request or handshake of an existing wireless connection protocol) or an independent transmitted packet. The sync signal may be the same signal for multiple sensors or may be different in time or format for one or more of the multiple sensors.

As one example of the above, an internal system (e.g., HMD 112 or console 106) operates at 60 Hz, and has Event A happen at the time t (as indicated in FIG. 12). For example, Event A may be a camera exposure window of an image capture device of the internal system. A trigger signal at the internal device also operates at 60 Hz, but has an offset of, e.g., t−0.5*16.7 ms (for 60 Hz), so Event A 1202 happens at approximately the center of the trigger signal. Sensor H (i.e., the primary magnetic sensor) may operate at any sensing sampling frequency, but in this example should be n*60 Hz (n is integers) and sample sensor data evenly. According to this example timing configuration, the magnetic sensor data may be sampled at approximately the center of Event A 1202 (+/−0.1 ms) and over an example 1-3 hours of battery life, the synchronization between magnetic sensors 1–n and Event A 1202 may not drift for more than +/−1 ms.

Figure 13:
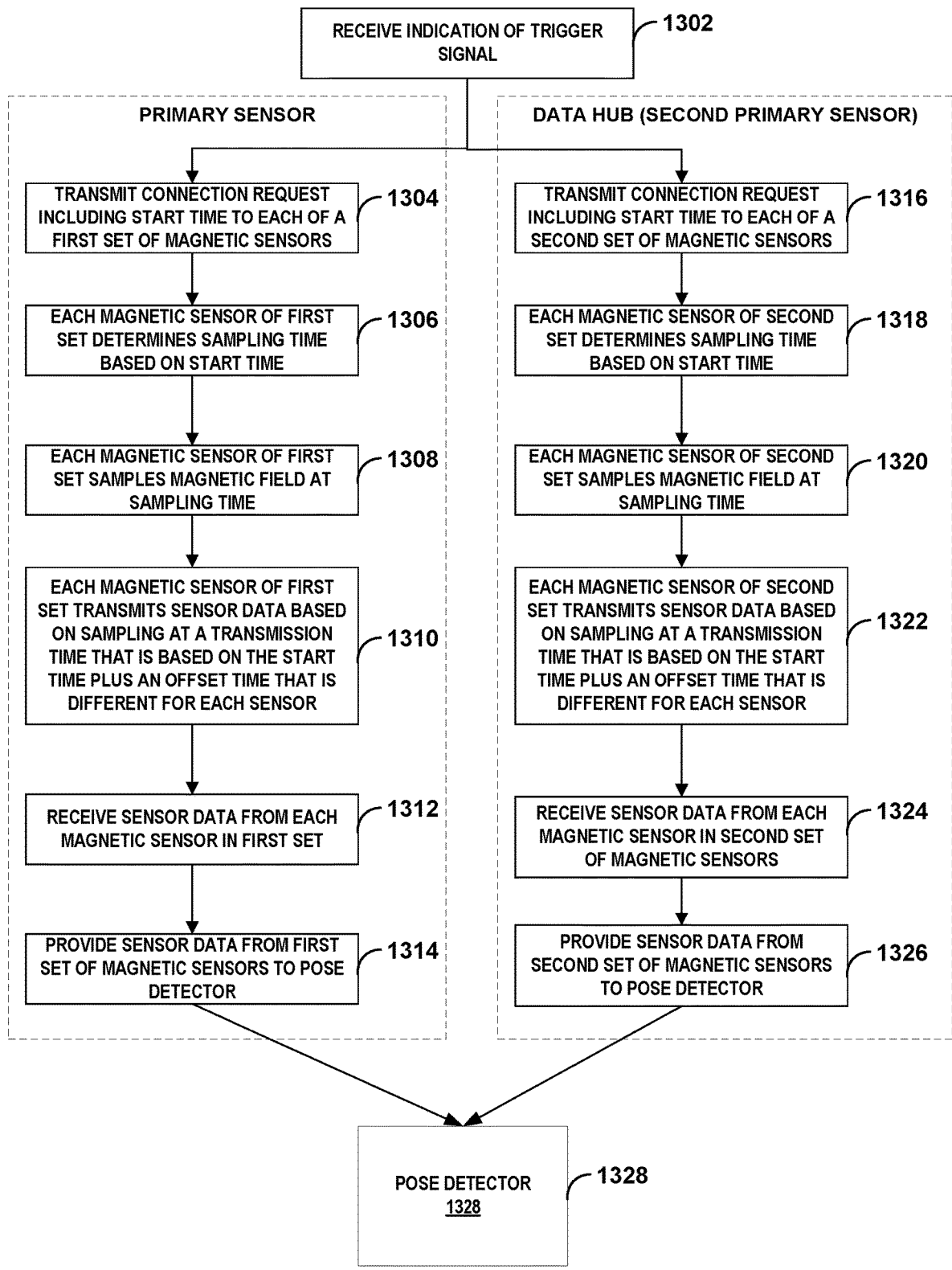
FIG. 13 is a flowchart illustrating operations of a method for synchronizing sampling frequency of magnetic sensors in accordance with the techniques of the disclosure.

FIG. 13 is a flowchart illustrating operations of a method for synchronizing sampling frequency of magnetic sensors in accordance with the techniques of the disclosure. An internal system, such as an HMD, console, machine-learning system etc. may generate a trigger signal. In response to receiving the trigger signal (1302), a primary magnetic sensor may transmit a connection request to a first set of magnetic sensors (1304). In some aspects, the connection request may conform to a wireless communication standard such as Bluetooth, WiFi, etc. In some aspects, the connection request may be modified to deviate from the communication standard by including a sampling start time value.

Each magnetic sensor in the first set of magnetic sensors may receive the connection request and determine one or more sampling times based on the receipt of the connection request (1306). In some aspects, the one or more sampling times may be based on the sampling start time in the connection request. The sampling times may be based on a frequency of an event such as a camera exposure window. For example, the sampling times may be determined based on a sampling offset based on one half of the frequency of the event. For example, a camera exposure window may open every 16.666 ms (e.g., 60 hz). The sampling time may be determined to be the center of the camera exposure window, which may be 8.333 ms from the trigger event.

Each of the magnetic sensors in the first set of magnetic sensors can sample a magnetic field generated by a magnetic transmitter at the sample time (1308). each magnetic sensor can each generate sensor data for the magnetic sensor based on the sampling of the magnetic field.

After generating the sensor data, each magnetic sensor can transmit the sensor data to the primary magnetic sensor (1310). In some aspects, the magnetic sensor transmits its sensor data at an offset time from the sampling time. In some aspects, the offset times for each magnetic sensor may be configured such that the transmission times for each of the magnetic sensors may be different so as to avoid overloading a wireless network used to communicate senor data.

The primary sensor can receive the sensor data transmitted by the first set of magnetic sensors (1312). The primary sensor can provide the collected sensor data to a pose detector such as pose detector 326, 426 or magnetic sensor pose detector 327, 427 (FIGS. 3, 4) (1314).

A data hub (e.g., data hub 139 or a second primary sensor) may perform operations 1316-1326 with respect to a second set of magnetic sensors. Operations 1316-1324 correspond to operations 1304-1314.

The techniques described in this disclosure may be implemented, at least in part, in hardware, software, firmware or any combination thereof. For example, various aspects of the described techniques may be implemented within one or more processors, including one or more microprocessors, DSPs, application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs). The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

What is claimed is:

1. A method comprising:
   receiving, by a primary magnetic sensor, an indication of a trigger event from an internal system, wherein a timing for the trigger event is based, at least in part, on a camera exposure window of one or more cameras of the internal system;
   in response to receiving the indication, transmitting, by the primary magnetic sensor, a synchronization packet to each of a plurality of magnetic sensors, wherein the synchronization packet includes a sampling start time value;
   in response to receiving the synchronization packet, determining, by each magnetic sensor of the plurality of magnetic sensors based on the sampling start time value, a sampling time for the magnetic sensor;
   sampling, by each magnetic sensor of the plurality of magnetic sensors at the sampling time for the magnetic sensor, a magnetic field generated by a magnetic transmitter associated with the plurality of magnetic sensors to generate sensor data of the magnetic sensor;
   providing, by each magnetic sensor of the plurality of magnetic sensors, to the primary magnetic sensor, the sensor data of the magnetic sensor, wherein the sensor data of the magnetic sensor is transmitted according to a transmission time that is based at least in part on the sampling time and an offset time for the magnetic sensor, wherein the offset times for at least two of the plurality of magnetic sensors are different; and
   providing, by the primary magnetic sensor, to a pose detector, the sensor data of each magnetic sensor of the plurality of magnetic sensors.

2. The method of claim 1, wherein the internal system comprises a head mounted display (HMD).

3. The method of claim 1, further comprising:
   in response to detecting a packet loss of a packet including the sensor data, retransmitting the sensor data within a frame beginning at a time of the trigger event.

4. The method of claim 1, wherein transmitting the synchronization packet comprises transmitting a Bluetooth connection request that is modified from a Bluetooth standard to include the sampling start time value.

5. The method of claim 1, wherein determining the sampling time is based, at least in part, a time that is one half of a sampling frequency.

6. The method of claim 5, wherein the sampling time is further based, at least in part, on a second offset provided by the primary magnetic sensor, the second offset based on an initial calibration of the magnetic sensors.

7. The method of claim 1, further comprising:
   updating, by each magnetic sensor of the plurality of magnetic sensors, a local sampling clock of the magnetic sensor in response to receiving the synchronization packet;
   wherein in response to the magnetic sensor failing to receive a second synchronization packet, the magnetic sensor determines the sampling time based on the local sampling clock of the magnetic sensor and a default frequency.

8. The method of claim 1, wherein the primary magnetic sensor is a first primary magnetic sensor, the method further comprising:
   receiving, by a second primary magnetic sensor, the indication of the trigger event from the internal system;
   in response to receiving the indication, transmitting, by the second primary magnetic sensor, a synchronization packet to each of a second plurality of magnetic sensors, wherein the synchronization packet includes a start time value;
   in response to receiving the synchronization packet, determining, by each second magnetic sensor of the second plurality of magnetic sensors based on the start time value, a second sampling time for the second magnetic sensor;
   sampling, by each second magnetic sensor of the second plurality of magnetic sensors at the second sampling time for the second magnetic sensor, the magnetic field generated by the magnetic transmitter to generate second sensor data of the second magnetic sensor;
   providing, by each second magnetic sensor of the second plurality of magnetic sensors, to the second primary magnetic sensor, the second sensor data of the second magnetic sensor, wherein the second sensor data of the second magnetic sensor is transmitted according to a second transmission time that is based, at least in part, on the second sampling time and a second offset time for the second magnetic sensor, wherein the second offset times for at least two of the second plurality of magnetic sensors are different; and
providing, by the second primary magnetic sensor, to the pose detector, the second sensor data of each second magnetic sensor of the second plurality of magnetic sensors.

9. The method of claim 1, wherein a magnetic sensor system for an artificial reality system that executes the pose detector comprises the primary magnetic sensor and the plurality of magnetic sensors.

10. The method of claim 1, further comprising:
computing, by the pose detector, a pose of an object based on the sensor data.

11. The method of claim 10, wherein the object is a human body.

12. An artificial reality system comprising:
an image capture device configured to capture image data representative of a physical environment;
a head mounted display (HMD) configured to output artificial reality content;
a magnetic transmitter configured to generate a magnetic field; and
a plurality of magnetic sensors including a primary magnetic sensor and non-primary magnetic sensors, wherein the primary magnetic sensor is configured to:
receive an indication of a trigger event from the HMD, wherein a timing for the trigger event is based, at least in part, on a camera exposure window of one or more cameras of the HMD, and
in response to receipt of the indication, transmit a synchronization packet to each non-primary magnetic sensor of the non-primary magnetic sensors, wherein the synchronization packet includes a sampling start time value;
wherein each non-primary magnetic sensor of the non-primary magnetic sensors is configured to:
in response to receipt of the synchronization packet, determine based on the sampling start time value, a sampling time for the non-primary magnetic sensor,
sample, at the sampling time for the non-primary magnetic sensor, a magnetic field generated by the magnetic transmitter to generate sensor data of the non-primary magnetic sensor, and
provide, to the primary magnetic sensor, the sensor data of the non-primary magnetic sensor, wherein the sensor data of the non-primary magnetic sensor is transmitted according to a transmission time that is based at least in part on the sampling time and an offset time for the non-primary magnetic sensor, wherein the offset times for at least two of the non-primary magnetic sensors are different;
wherein the primary magnetic sensor is further configured to provide, to a pose detector of the artificial reality system, sensor data of the primary magnetic sensor and the sensor data of each non-primary magnetic sensor of the plurality of magnetic sensors, wherein the pose detector is configured to determine a pose for an object based, at least in part on the image data, the sensor data of each non-primary magnetic sensor of the plurality of magnetic sensors, and the sensor data of the primary magnetic sensor.

13. The artificial reality system of claim 12, wherein the synchronization packet comprises a Bluetooth connection request that is modified from a Bluetooth standard to include the sampling start time value.

14. The artificial reality system of claim 12, wherein each non-primary magnetic sensor is further configured to update a local sampling clock of the magnetic sensor in response to receiving the synchronization packet;
wherein in response to a failure to receive a second synchronization signal packet, the non-primary magnetic sensor determines the sampling time based on the local sampling clock of the magnetic sensor and a default frequency.

15. The artificial reality system of claim 12, wherein the primary magnetic sensor is a first primary magnetic sensor, the system further comprising:
a second plurality of magnetic sensors including a second primary magnetic sensor and second non-primary magnetic sensors, wherein the second primary magnetic sensor is configured to:
receive the indication of the trigger event from the HMD;
in response to receipt of the indication, transmit a second synchronization packet to each of second non-primary magnetic sensor of the second non-primary magnetic sensors, wherein the second synchronization packet includes a second start time value;
wherein each second non-primary magnetic sensor of the second non-primary magnetic sensors is configured to:
in response to receipt of the second synchronization packet, based on the second start time value, a second sampling time for the second non-primary magnetic sensor,
sample, at the second sampling time for the second non-primary magnetic sensor, the magnetic field generated by the magnetic transmitter to generate second sensor data of the second non-primary magnetic sensor, and
provide, to the second primary magnetic sensor, the second sensor data of the second non-primary magnetic sensor, wherein the second sensor data of the second non-primary magnetic sensor is transmitted according to a second transmission time that is based, at least in part, on the second sampling time and a second offset time for the second non-primary magnetic sensor, wherein the second offset times for at least two of the second non-primary magnetic sensors are different; and
wherein the second primary magnetic sensor is further configured to provide, to the pose detector of the artificial reality system, sensor data of the second primary magnetic sensor and the sensor data of each second non-primary magnetic sensor of the second magnetic sensors, wherein the pose detector is further configured to determine the pose for the object based, at least in part on the sensor data of each second non-primary magnetic sensor of the second magnetic sensors, and sensor data of the second primary magnetic sensor.

16. A magnetic sensor system comprising:
a magnetic transmitter configured to generate a magnetic field; and
a plurality of magnetic sensors including a primary magnetic sensor and non-primary magnetic sensors, wherein the primary magnetic sensor is configured to:
receive an indication of a trigger event from a trigger source, wherein a timing for the trigger event is based, at least in part, on a camera exposure window of one or more cameras of the trigger source, and in response to receipt of the indication, transmit a synchronization packet to each non-primary magnetic sensor of the non-primary magnetic sensors, wherein the synchronization packet includes a sampling start time value;

wherein each non-primary magnetic sensor of the non-primary magnetic sensors is configured to:

in response to receipt of the synchronization packet, determine based on the sampling start time value, a sampling time for the non-primary magnetic sensor, sample, at the sampling time for the non-primary magnetic sensor, a magnetic field generated by the magnetic transmitter to generate sensor data of the non-promary magnetic sensor, provide, to the primary magnetic sensor, the sensor data of the non-primary magnetic sensor, wherein the sensor data of the non-primary magnetic sensor is transmitted according to a transmission time that is based at least in part on the sampling time and an offset time for the non-primary magnetic sensor, wherein the offset times for at least two of the non-primary magnetic sensors are different; and wherein the primary magnetic sensor is further configured to provide, as output of the magnetic sensor system, sensor data of the primary magnetic sensor and the sensor data of each non-primary magnetic sensor of the plurality of magnetic sensors.

17. The magnetic sensor system of claim 16, wherein the synchronization packet comprises a Bluetooth connection request that is modified from a Bluetooth standard to include the sampling start time value.

18. The magnetic sensor system of claim 16, further comprising:

a second plurality of magnetic sensors;
a data hub configured to:

receive the indication of the trigger event from the trigger source;

in response to receipt of the indication, transmit a synchronization packet to each second magnetic sensor of the second plurality of magnetic sensors, wherein the synchronization packet includes a second start time value;

wherein each second magnetic sensor of the second plurality of magnetic sensors is configured to:

in response to receipt of the synchronization packet, based on the second start time value, a second sampling time for the second magnetic sensor, sample, at the second sampling time for the second magnetic sensor, the magnetic field generated by the magnetic transmitter to generate second sensor data of the second magnetic sensor, and provide, to the data hub, the second sensor data of the second magnetic sensor, wherein the second sensor data of the second magnetic sensor is transmitted according to a second transmission time that is based, at least in part, on the second sampling time and a second offset time for the second magnetic sensor, wherein the second offset times for at least two of the second magnetic sensors are different; and wherein the data hub is further configured to provide, as the output of the magnetic sensor system, the sensor data of each second magnetic sensor of the second magnetic sensors.

19. The magnetic sensor system of claim 18, wherein the second plurality of magnetic sensors includes a second primary magnetic sensor, and wherein the data hub comprises the second primary magnetic sensor.

* * * * *